US 6,661,054 B1

(12) United States Patent
Nakamura

(10) Patent No.: US 6,661,054 B1
(45) Date of Patent: *Dec. 9, 2003

(54) SEMICONDUCTOR DEVICE AND METHOD OF FABRICATING THE SAME

(75) Inventor: Katsumi Nakamura, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 371 days.

(21) Appl. No.: 09/122,094

(22) Filed: Jul. 24, 1998

(30) Foreign Application Priority Data

Mar. 5, 1998 (JP) .......................... P10-053427

(51) Int. Cl.[7] .............................. H01L 29/76
(52) U.S. Cl. .................. 257/330; 257/331; 257/333
(58) Field of Search ................. 257/330, 331, 257/333

(56) References Cited

U.S. PATENT DOCUMENTS

| | | | | |
|---|---|---|---|---|
| 5,485,031 A | * | 1/1996 | Zhang et al. | 257/530 |
| 5,541,425 A | | 7/1996 | Nishihara | |
| 5,869,874 A | * | 2/1999 | Manning | 257/751 |
| 5,880,508 A | * | 3/1999 | Wu | 257/411 |
| 5,894,149 A | * | 4/1999 | Uenishi et al. | 257/341 |
| 6,025,269 A | * | 2/2000 | Sandhu | 438/642 |

FOREIGN PATENT DOCUMENTS

| | | |
|---|---|---|
| JP | 7-326738 | 12/1995 |
| JP | 8-23092 | 1/1996 |
| JP | 9-331063 | 12/1997 |

OTHER PUBLICATIONS

T. Kuroi, et al., "Proximity Gettering of Micro–Defects by High Energy Ion Implantation," Extended Abstracts of the 1991 International Conference on Solid State Devices and Materials, Yokohama, 1991, pp. 56–58.

* cited by examiner

Primary Examiner—Sara Crane
(74) Attorney, Agent, or Firm—Oblon, Spivak, McClelland, Maier & Neustadt, P.C.

(57) ABSTRACT

A gate electrode <13> is provided to fill up a trench <300> while covering its opening. Assuming that $W_G$ represents the diameter (sectional width) of a head portion of the gate electrode <13> located upward beyond a P-type base layer <4> and an N$^+$-type emitter diffusion layer <51>, $W_T$ represents the diameter (sectional width) of an inner wall of a linearly extending portion of the trench <300> and $W_C$ represents the distance between the boundary (the inner wall of the trench 300) between a gate oxide film <11> and the P-type base layer <4> and an end surface of the gate electrode <13> located upward beyond the trench <300> in a section of the trench <300>, relation of either $W_G \geq 1.3 \cdot W_T$ or $W_C \geq 0.2$ μm holds between these dimensions.

3 Claims, 34 Drawing Sheets

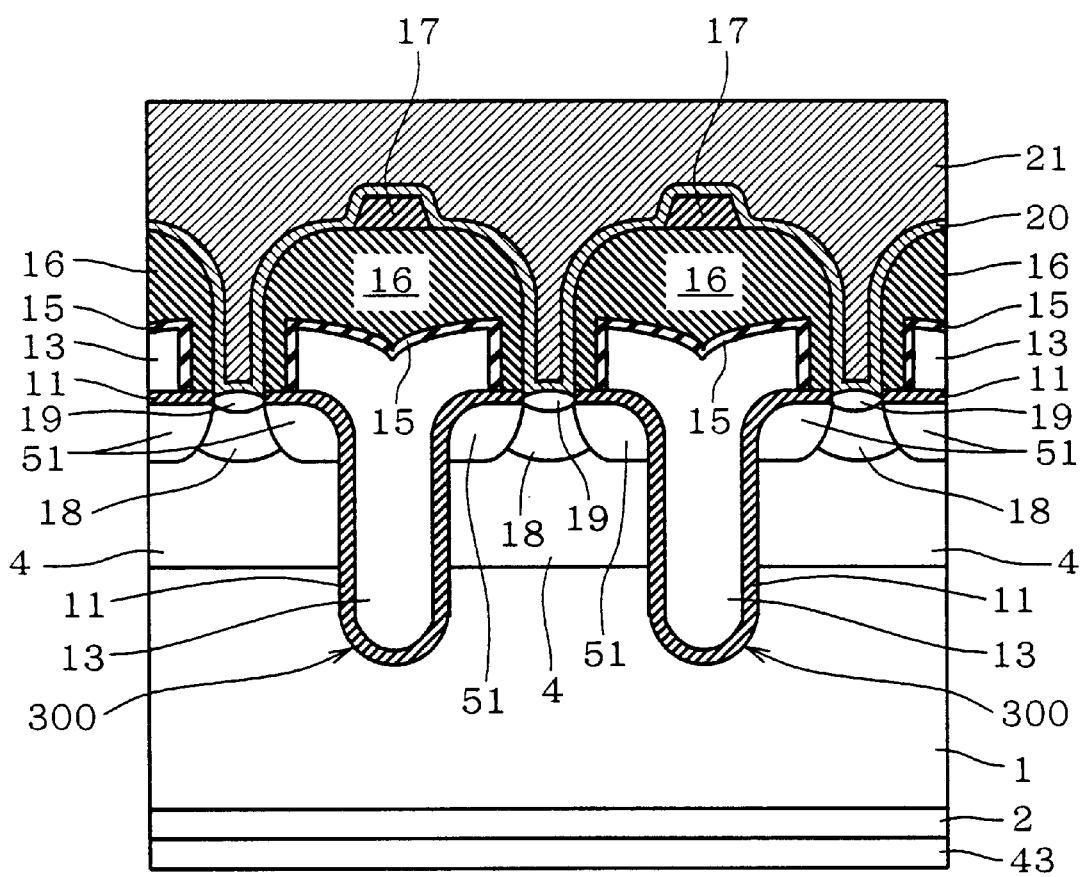
F I G . 4 0

SEMICONDUCTOR DEVICE AND METHOD OF FABRICATING THE SAME

BACKGROUND OF THE INVENTION

1. Field of the Invention

The present invention relates to a semiconductor device, and more particularly, it relates to a technique of forming a trench MOS gate which is applied to a power device.

2. Description of the Background Art

FIGS. 41 to 48 are sectional views showing a conventional process of forming trench MOS gates in step order. First, the structure shown in FIG. 41 is prepared. Referring to FIG. 41, the structure is obtained by successively stacking a P-type semiconductor layer 103 having a high impurity concentration, an N-type semiconductor layer 102 having a high impurity concentration, an N-type semiconductor layer 101 having a low impurity concentration and a P-type base layer 104 from the lower side, and trenches 200 are formed between an upper surface of the P-type base layer 104 and an intermediate portion of the N-type semiconductor layer 101. On the upper surface of the P-type base layer 104, N-type semiconductor layers 105 having a high impurity concentration are selectively formed around the trenches 200.

Then, a gate oxide film 111 is formed over the entire surface, including inner walls of the trenches 200, exposed on the upper side of the structure shown in FIG. 41 (FIG. 42). Further, a gate electrode material layer 112 of polysilicon or the like is provided on the gate oxide film 111, to fill up the trenches 200 (FIG. 43). Only the parts of the gate electrode material layer 112 filling up the trenches 200 are left as gate electrodes 113, and the remaining parts are removed by etching (FIG. 44).

Thereafter surfaces of the gate electrodes 113 are oxidized to form oxide films 115 (FIG. 45). P-type semiconductor layers 118 having a high impurity concentration are formed on parts of the P-type base layer 104 exposed between the adjacent N-type semiconductor layers 105 by ion implantation through the oxide films 111 or the like, and interlayer isolation films 116 and 117 are deposited in this order with oxide films formed by CVD, for example (FIG. 46). The interlayer isolation films 116 and 117 are selectively etched to be left only on the gate electrodes 113, as shown in FIG. 47.

Further, suicide layers 119 are formed on upper surfaces of the N-type semiconductor layers 105, the P-type semiconductor layers 118 and the gate electrodes 113 by sputtering or lamp annealing, and a barrier metal layer 120 and an aluminum interconnect line 121 are deposited on the overall surface (FIG. 48). FIG. 49 is a sectional view taken along the line Q—Q in FIG. 48. Referring to FIG. 49, isolation oxide films 122 and P-type semiconductor layers 123 are provided on both sides of each trench 200. The aluminum interconnect line 121 is connected with each gate electrode 113 on end portions of each trench 200 through the silicide layers 119 and the barrier metal layer 120.

The conventional trench MOS gates are formed in the aforementioned manner in the structure shown in FIGS. 48 and 49. Therefore, the gate oxide film 111 is locally reduced in thickness on openings C and bottom portions D of the trenches 200. Particularly in the openings C, convex corners appear in the gate oxide film 111 on the interfaces between the same and the gate electrodes 113. In the openings C, further, the gate oxide film 111 is damaged by etching of the gate electrode material layer 112 in the steps shown in FIGS. 43 and 44 to deteriorate the characteristics of the gate oxide film 111, as a first problem.

If the aluminum interconnect line 121 is inferior in flatness, the trench MOS gates are readily broken by an impact in an operation (on-cell bonding) of bonding aluminum thin wires of 50 to 400 $\mu$m in diameter to the aluminum interconnect line 121 in an assembly step for transistors employing the trench MOS gates. Further, contact areas of the aluminum interconnect line 121 and the aluminum thin wires may tend to be reduced, to increase the resistance in the contact parts. In this case, the resistance of the transistors employing the trench MOS gates is apparently increased in ON states, as a second problem.

If the aluminum interconnect line 121 is formed in a large thickness in order to solve the second problem, a wafer provided with the trench MOS gates so remarkably warps that it is difficult to carry out an exposure step, as a third problem.

SUMMARY OF THE INVENTION

A semiconductor device according to a first aspect of the present invention comprises a semiconductor substrate having a main surface, a trench having an opening on the main surface and a bottom portion in the semiconductor substrate respectively, an insulating film which is provided on an inner wall of the trench and a portion of the main surface around the opening, and a conductive material film which is provided oppositely to the semiconductor substrate through the insulating film and has a head portion which is farther from the opening of the trench than the main surface, and an end surface of the head portion is separated from the bottom portion of the trench than the inner wall by at least 0.2 $\mu$m.

According to a second aspect of the present invention, the diameter of the head portion is at least 1.3 times the diameter of the inner wall of the trench in a linearly extending portion of the trench.

A method of fabricating a semiconductor device according to a third aspect of the present invention comprises steps of (a) preparing a semiconductor substrate having a main surface, b) forming a trench having an opening on the main surface and a bottom portion in the semiconductor substrate respectively, (c) forming an insulating film on an inner wall of the trench and a portion of the main surface around the opening, (d) forming a conductive material film covering the insulating film, and (e) selectively removing a part of the conductive material film which is separated from the opening than the inner wall of the trench by at least 0.2 $\mu$m thereby forming a head portion.

According to a fourth aspect of the present invention, the diameter of the head portion is at least 1.3 times the diameter of the inner wall of the trench in a linearly extending portion of the trench.

In the semiconductor device and the method of fabricating a semiconductor device according to the first to fourth aspects of the present invention, a part of the insulating film close to the opening of the trench is not subjected to etching for shaping the conductive material film, so that the quality of the insulating film located on the opening is not deteriorated by plasma damage resulting from the etching. Thus, a trench MOS gate having excellent characteristics can be obtained.

A method of fabricating a semiconductor device according to a fifth aspect of the present invention comprises steps of (a) preparing a semiconductor substrate having a main surface, (b) forming a hole having an opening on the main surface and a bottom portion in the semiconductor substrate respectively, (c) annealing a structure obtained in the step (b), (d) forming a sacrifice oxide film by oxidizing an inner wall of the hole, (e) forming a trench by removing the sacrifice oxide film, (f) forming an insulating film by oxidizing an inner wall of the trench, and (g) forming a conductive material film covering the insulating film.

In the method of fabricating a semiconductor device according to the fifth aspect of the present invention, defects caused in the semiconductor substrate in formation of the hole concentrate to the inner wall of the hole by annealing to be removed by formation and removal of the sacrifice oxide film, whereby the insulating film obtained by oxidizing the trench excellently serves as a gate insulating film.

A semiconductor device according to a sixth aspect of the present invention comprises a gate electrode presenting a MOS structure, a first conductive layer provided on the gate electrode, and a second conductive layer, intervening between the gate electrode and the first conductive layer, having higher strength than the first conductive layer.

In the semiconductor device according to the sixth aspect of the present invention, the second conductive layer serves as a buffer for the gate electrode in bonding of the first conductive layer. Further, the flatness of the first conductive layer is improved due to the intervention of the second conductive layer. Therefore, the gate electrode presenting the MOS structure is prevented from being broken by an impact of bonding, or resistance of a transistor employing the same is prevented from being apparently increased in an ON state.

A method of fabricating a semiconductor device according to a seventh aspect of the present invention comprises steps of (a) forming a gate electrode presenting a MOS structure on a semiconductor substrate, b) forming a first conductive layer on the gate electrode, (c) patterning the first conductive layer, and (d) forming a second conductive layer on the first conductive layer.

In the method of fabricating a semiconductor device according to the seventh aspect of the present invention, the total thickness of the first and second conductive layers present above the gate electrode is increased. Further, the second conductive layer is formed after the area of the first conductive layer is reduced by patterning, whereby the semiconductor substrate is inhibited from warping. Therefore, it is possible to avoid such a situation that exposure cannot be performed while relaxing an impact of bonding against the second conductive layer.

According to an eighth aspect of the present invention, the step (c) includes a step of (c-1) patterning the first conductive layer while dividing the same into a first part which is connected to the gate electrode and the second conductive layer and a second part which is connected to an impurity region forming a MOS transistor with the gate electrode, and the method further comprises a step of (e) forming an interlayer insulating film intervening between the first part and the second conductive layer between the steps (c) and (d).

In the method of fabricating a semiconductor device according to the eighth aspect of the present invention, shorting between the second conductive layer and the gate electrode can be prevented while providing the second conductive layer on the first conductive layer.

An object of the present invention is to provide a semiconductor device which improves the characteristics of a gate oxide film and a method of fabricating the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 37 to 40 are sectional views showing the structure of an element to which the present invention is applicable;

DESCRIPTION OF THE PREFERRED EMBODIMENTS

Embodiment 1

Figure 1:
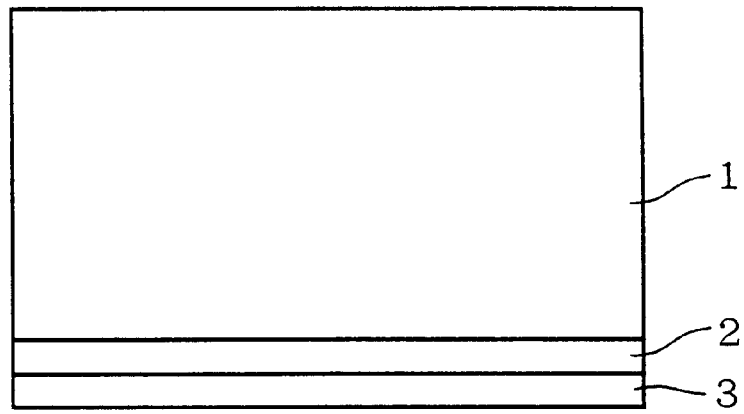
FIGS. 1 and 2, are sectional views showing an embodiment 1 of the present invention in step order.
Figure 2:
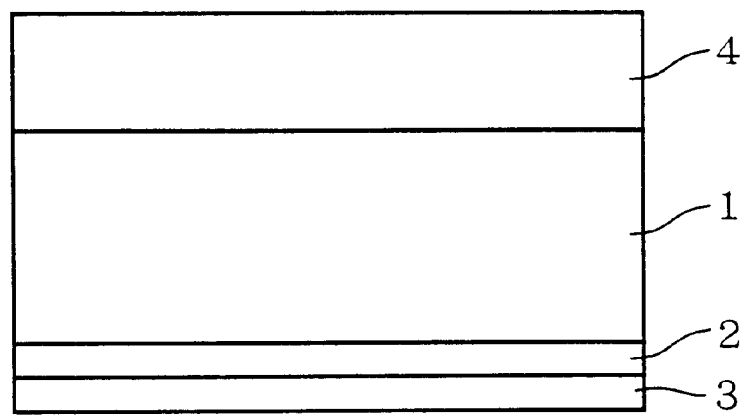
Figure 3:
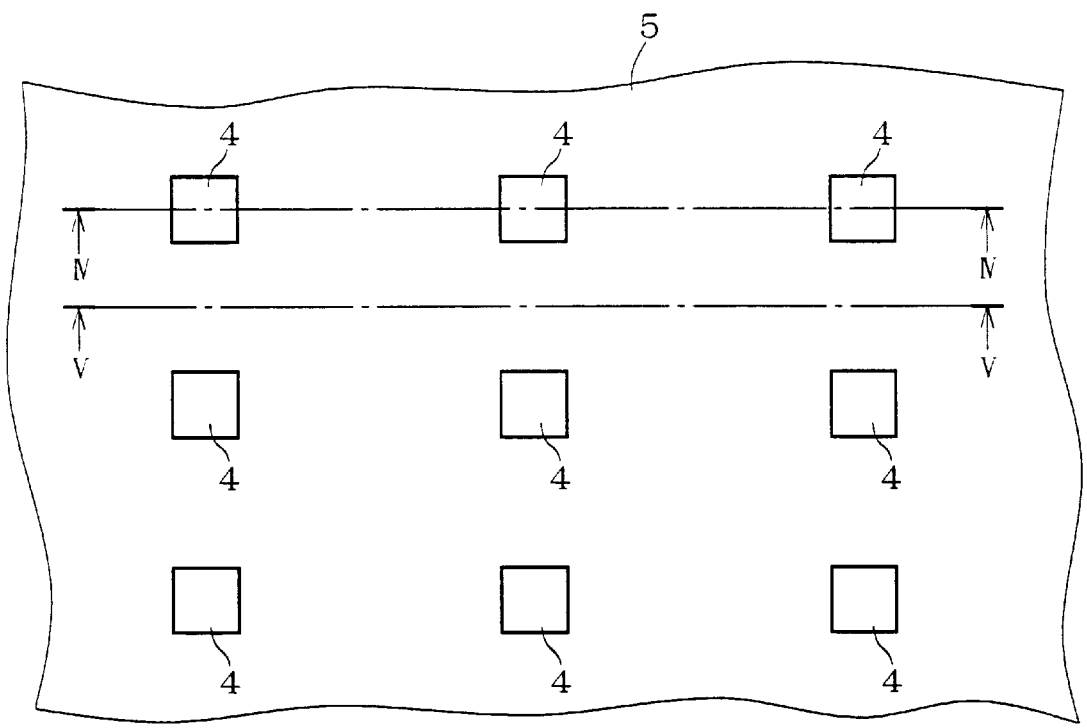
FIG. 3 is a top plan view showing the embodiment 1 of the present invention.

FIGS. 1, 2 and 4 to 15 are sectional views showing a method of fabricating an IGBT according to an embodiment 1 of the present invention in step order, and FIG. 3 is a top plan view of the IGBT. First, the structure shown in FIG. 1 is obtained by stacking a $P^+$-type semiconductor layer 3 having a high impurity concentration, an N-type semiconductor layer 2 and an $N^-$-type semiconductor layer 1 having a low impurity concentration successively from below. For example, silicon is employable as a semiconductor material. The N⁻-type semiconductor layer 1 has an impurity concentration of $1\times10^{12}$ to $1\times10^{14}$ cm⁻³ and a thickness of 40 to 600 μm. The N-type semiconductor layer 2 has an impurity concentration peak of not more than $1\times10^{18}$ cm⁻³, and a diffusion depth, exceeding that of the P⁺-type semiconductor layer 3, of not more than 400 μm. The P⁺-type semiconductor layer 3 has an impurity concentration peak of at least $2\times10^{18}$ cm⁻³ on its surface, and its diffusion depth is below that of the N-type semiconductor layer 2. Such a structure can be obtained by implanting ions into a rear surface (lower surface in FIG. 1) of the N⁻-type semiconductor layer 1 and diffusing the same thereby successively forming the N-type semiconductor layer 2 and the P⁺-type semiconductor layer 3. The structure may alternatively be formed by epitaxy, as a matter of course.

Figure 4:
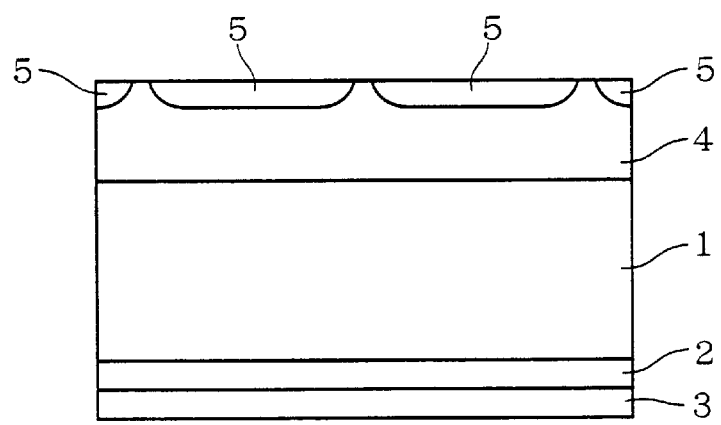
FIGS. 4 to 17 are sectional views showing the embodiment 1 of the present invention in step order.
Figure 5:
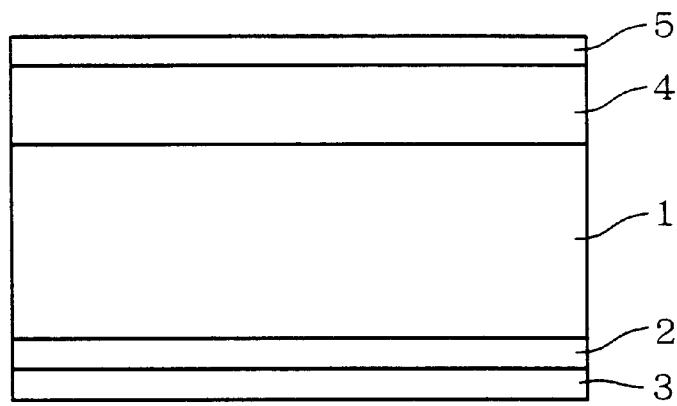
Figure 6:
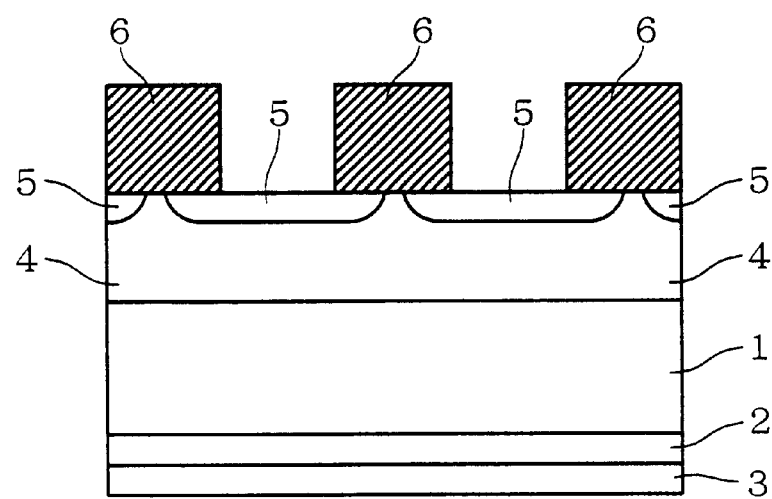

Then, a P-type base layer 4 is formed on a surface (upper surface in FIG. 1) of the N⁻-type semiconductor layer 1. The P-type base layer 4 has an impurity concentration peak of $1\times10^{15}$ to $1\times10^{18}$ cm⁻³ and a diffusion depth of 1 to 4 μm, for example. Further, N⁺-type diffusion layers 5 are selectively formed on an upper surface of the P-type base layer 4 in the form of lattice (FIG. 3). The N⁺-type diffusion layers 5 have an impurity concentration of $1\times10^{18}$ to $1\times10^{20}$ cm⁻³ on surfaces thereof, and a diffusion depth of 0.3 to 2 μm. FIGS. 4 and 5 are sectional views taken along the lines IV—IV and V—V in FIG. 3 respectively. The structure in the section taken along the line IV—IV is hereafter described. Then, oxide films 6 covering end portions of the adjacent N⁺-type diffusion layers 5 and portions of the P-type base layer 4 enclosed with the same while exposing central portions of the N⁺-type diffusion layers 5 are formed by film formation by CVD and patterning, for example (FIG. 6).

Figure 7:
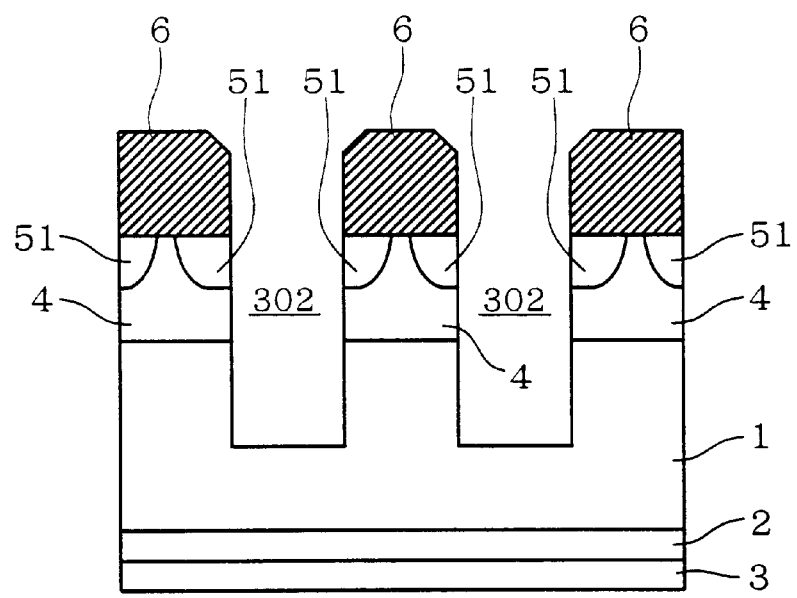

The oxide films 6 are employed as masks to perform etching, thereby forming trenches 302, passing through the N⁻-type semiconductor layer 1 and the N⁺-type diffusion layers 5, having bottom portions in the P-type base layer 4. The N⁺-type diffusion layers 5 remain in portions around openings of the trenches 302 as N⁺-type emitter diffusion layers 51 (FIG. 7).

Figure 8:
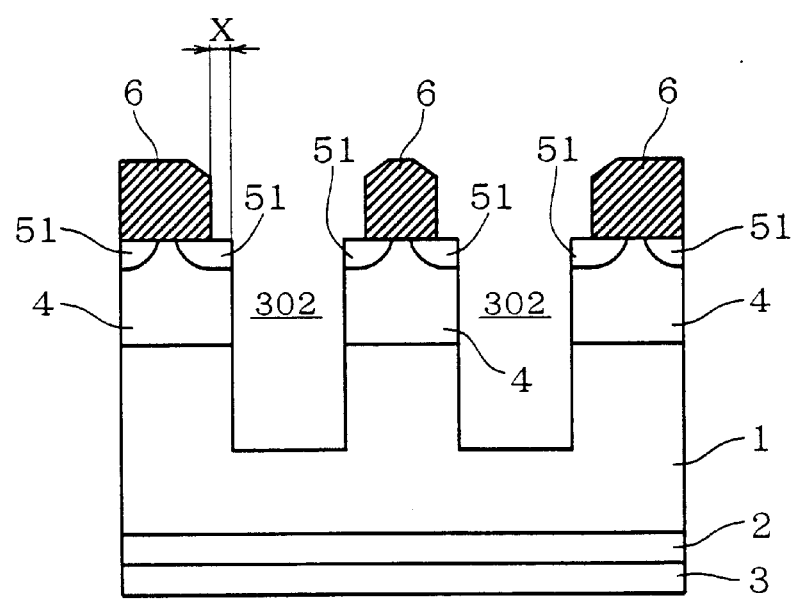
Figure 9:
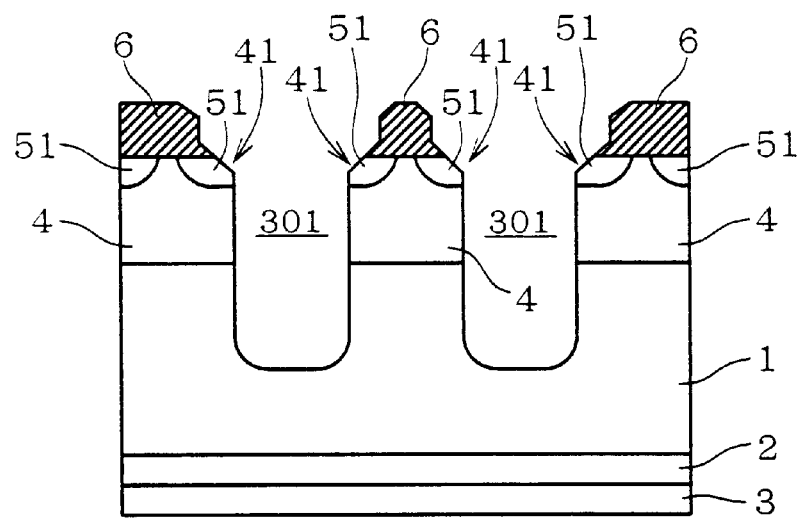

Thereafter the oxide films 6 are isotropically etched for retracting end portions thereof from the openings of the trenches 302 by a distance x in a transverse direction perpendicular to the thickness direction of the N⁻-type semiconductor layer 1 (FIG. 8). Then, the semiconductor is isotropically etched, thereby rounding corners of the N⁺-type emitter diffusion layers 51 located on the openings of the trenches 302 and portions of the P-type base layer 4 located on the bottom portions of the trenches 302 and forming trenches 301 (FIG. 9).

Figure 10:
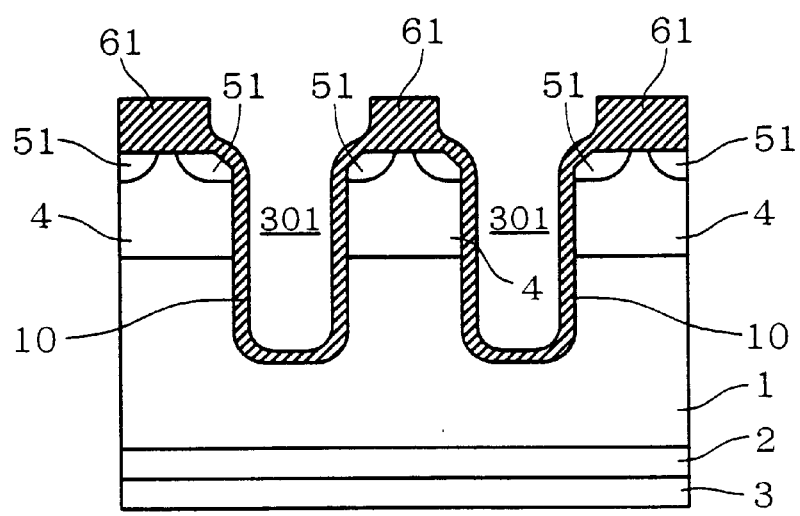
Figure 11:
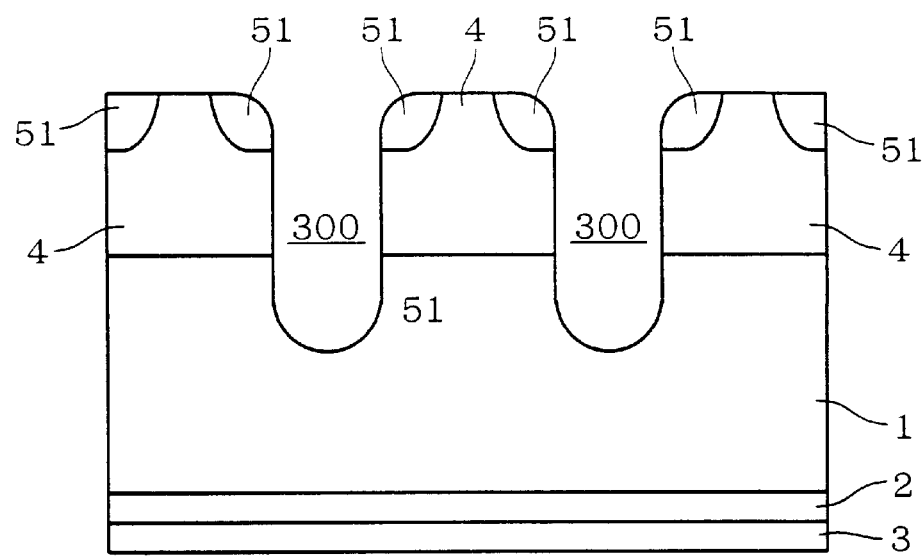

Thereafter thermal oxidation is performed, thereby temporarily forming a sacrifice oxide film 10 on inner walls of the trenches 301 (FIG. 10). At this time, the oxide films 6 are increased in thickness to define oxide films 61. Thereafter the sacrifice oxide film 10 and the oxide films 61 are removed by etching. Thus, openings and bottom portions of the trenches 301 are further rounded while side walls thereof are further smoothed, to define trenches 300 (FIG. 11).

For example, Japanese Patent Laying-Open Gazette No.7-263692 (1995), herein incorporated by reference, describes the technique of forming the trenches 302, 301 and 300 in this order, smoothing the side walls thereof and rounding the corners thereof as shown in FIGS. 7 to 11. For example, plasma etching of the silicon is performed to the trenhes 302 by using gas such as O₂ and /or CF₄, to form the trenches 301. Then the sacrifice oxide film 10 is formed by about 100 to 300 nm at a temperature of 950 to 1100° C. in an oxygen atmosphere. Thereafter thermal oxidation is performed in a vapor or oxygen atmosphere of at least 950° C., for example, for forming a gate oxide film 11 on the surface exposed in the structure shown in FIG. 11, including inner walls of the trenches 300.

Alternatively, a new sacrifice oxide film may be formed on and removed from the structure shown in FIG. 1. following formation and removal of the sacrifice oxide film 110, in advance of formation of the gate oxide film 11. The new sacrifice oxide film is formed in a vapor atmosphere at a temperature lower than that for forming the sacrifice oxide film 10, for example. In this case, the gate oxide film 11 is preferably formed by thermal oxidation in a vapor atmosphere at a temperature of not more than 1000° C., for example, in order to improve the effect of rounding the bottom portions of the trenches 300.

Figure 12:
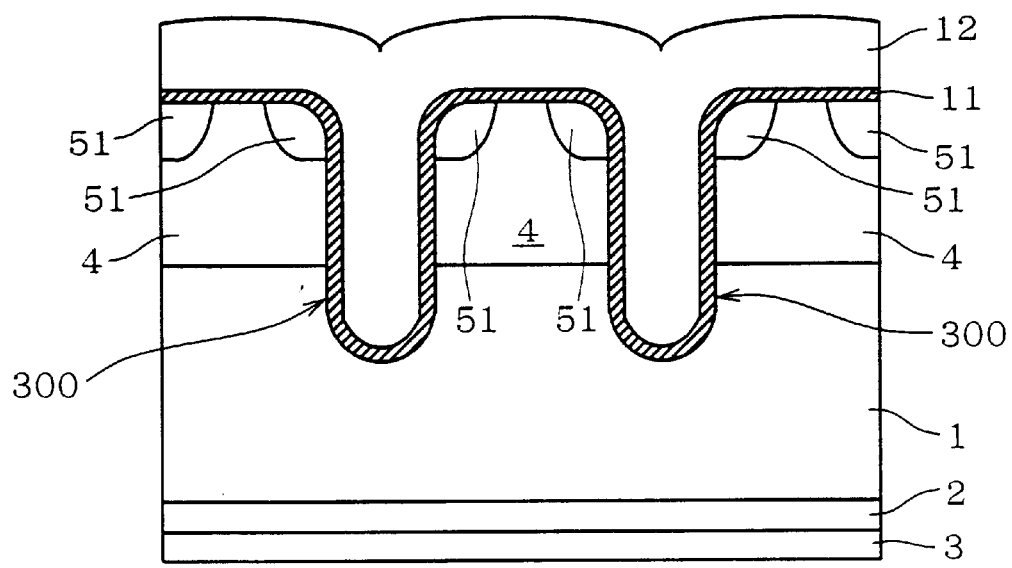

A polycrystalline silicon film 12 for gate electrodes is formed to cover the gate oxide film 11 and fill up the trenches 300 (FIG. 12). The polycrystalline silicon film 12 for gate electrodes may be prepared from a film containing phosphorus in a high concentration, or an undoped film into which phosphorus is ion-implanted, for example.

Figure 13:
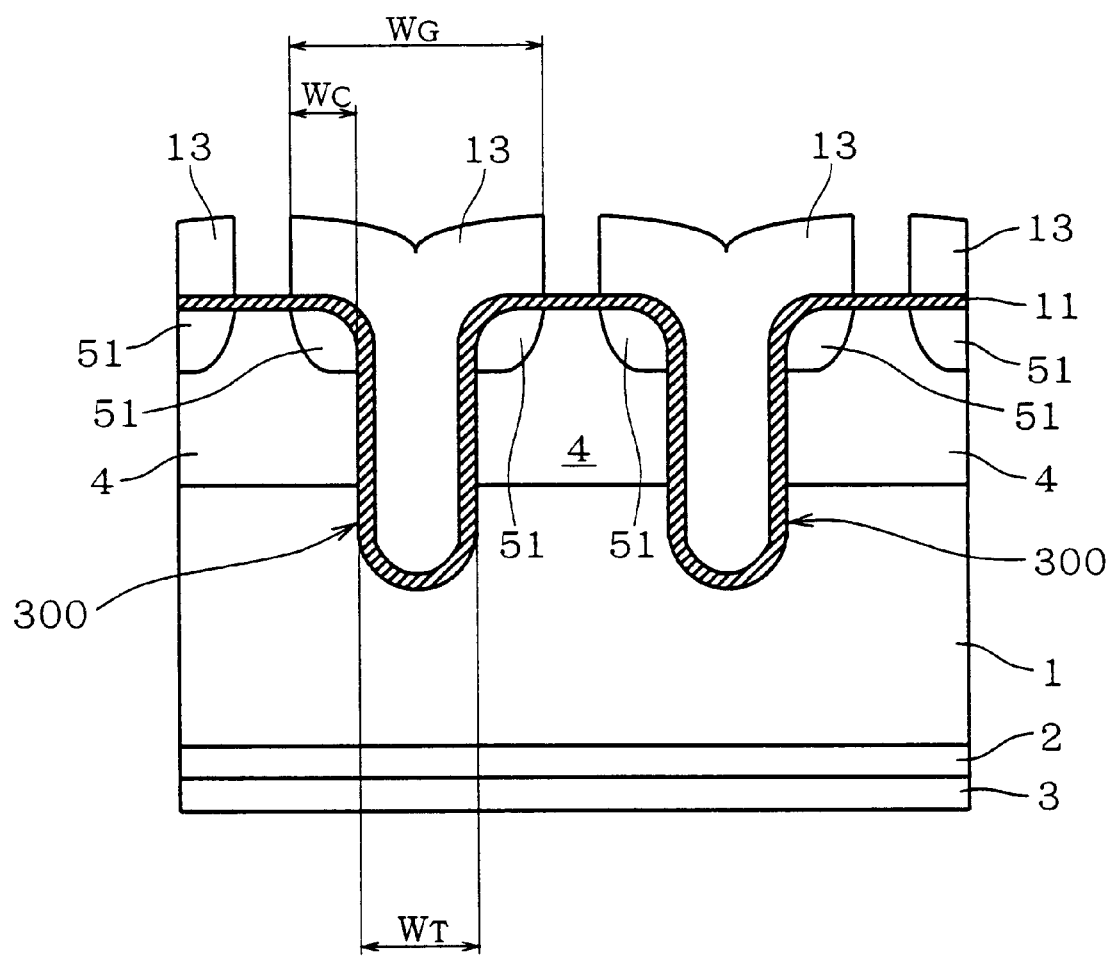

The polycrystalline silicon film 12 for gate electrodes is patterned, thereby obtaining gate electrodes 13 filling up the trenches 300 while covering openings of the trenches 300 and portions around the same. Referring to FIG. 13, symbol $W_G$ denotes the diameter (sectional width) of head portions of the gate electrodes 13 located upward beyond the P-type base layer 4 and the N⁺-type emitter diffusion layers 51, symbol $W_T$ denotes the diameter (sectional width) of the inner wall linearly extending portions of the trenches 300, and symbol $W_C$ denotes the distance between boundaries between the gate oxide film 11 and the P-type base layer 4, i.e., the inner walls of the trenches 300, in sections of the trenches 300 and end surfaces of the gate electrodes 13 located on portions upward beyond the trenches 300 (FIG. 13).

Relation of either $W_G \geq 1.3 \cdot W_T$ or $W_C \geq 0.2$ μm holds between the aforementioned dimensions $W_G$, $W_T$ and $W_C$. Namely, portions of the polycrystalline silicon film 12 for gate electrodes located above the P-type base layer 4 and the N⁺-type emitter diffusion layers 51 which are separated by at least 0.2 μm from the openings of the trenches 300 as compared with the inner walls are selectively removed. Alternatively, head portions having a diameter which is at least 1.3 times that of the inner walls of the trenches 300 are formed.

Figure 14:
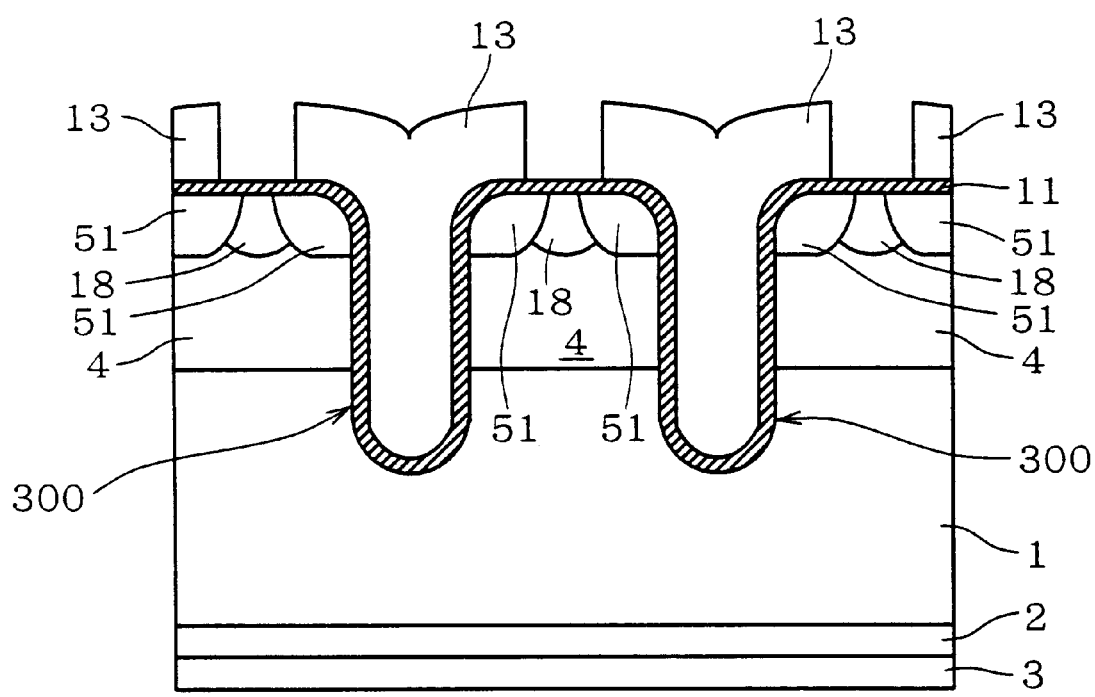
Figure 15:
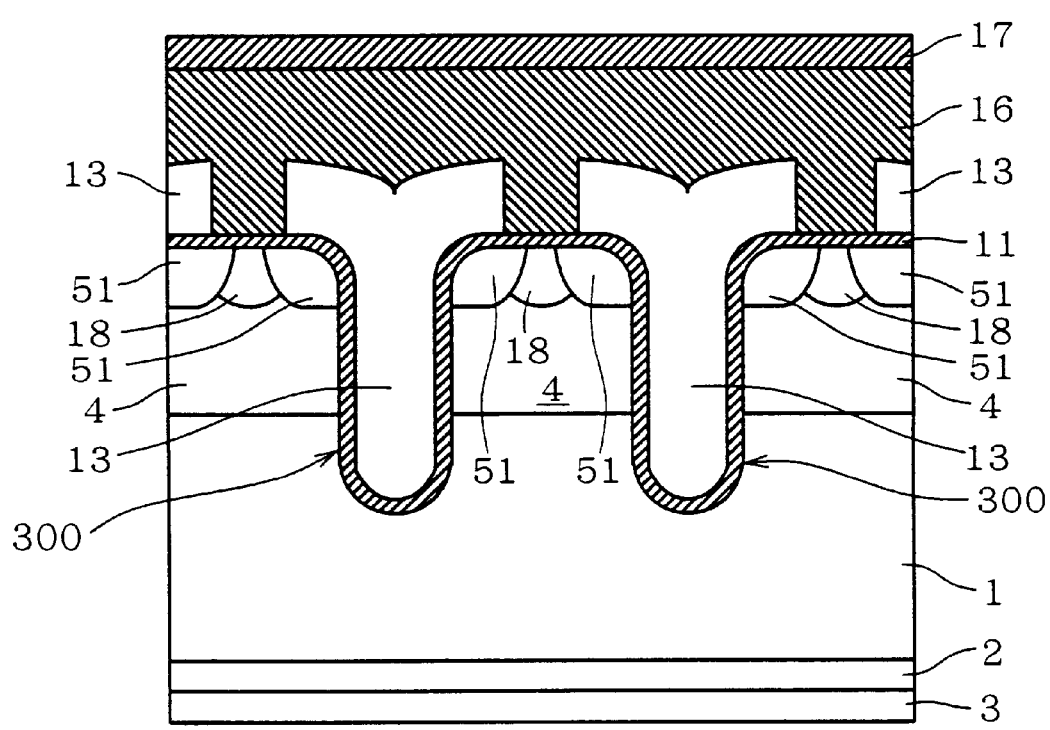
Figure 16:
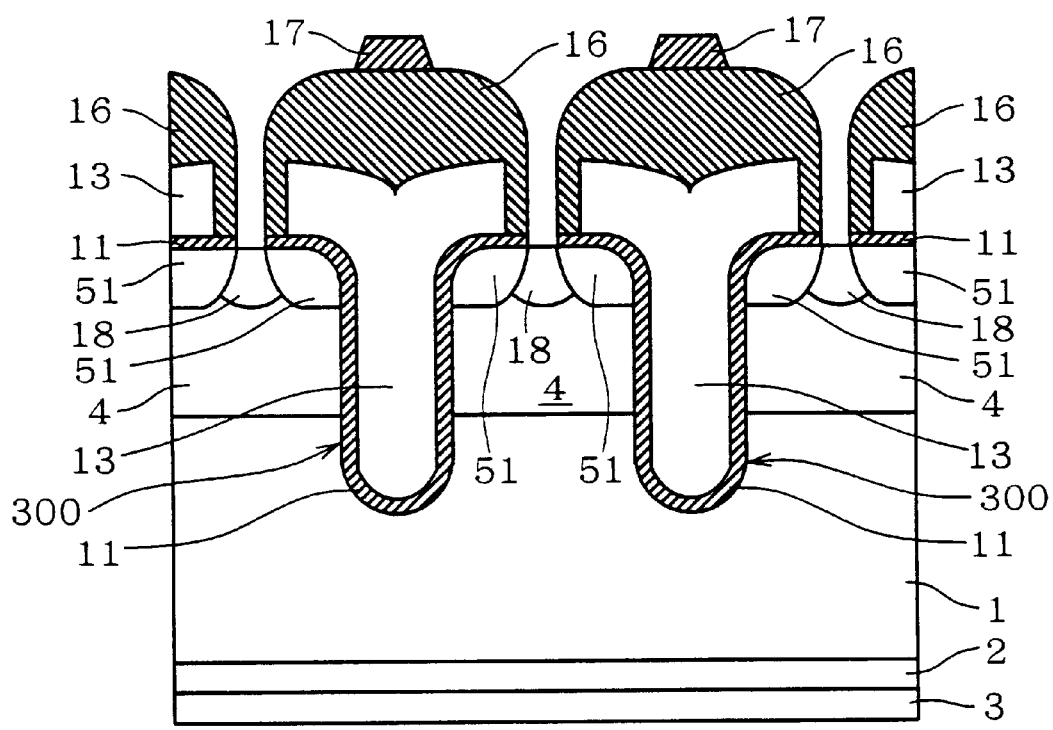
Figure 17:
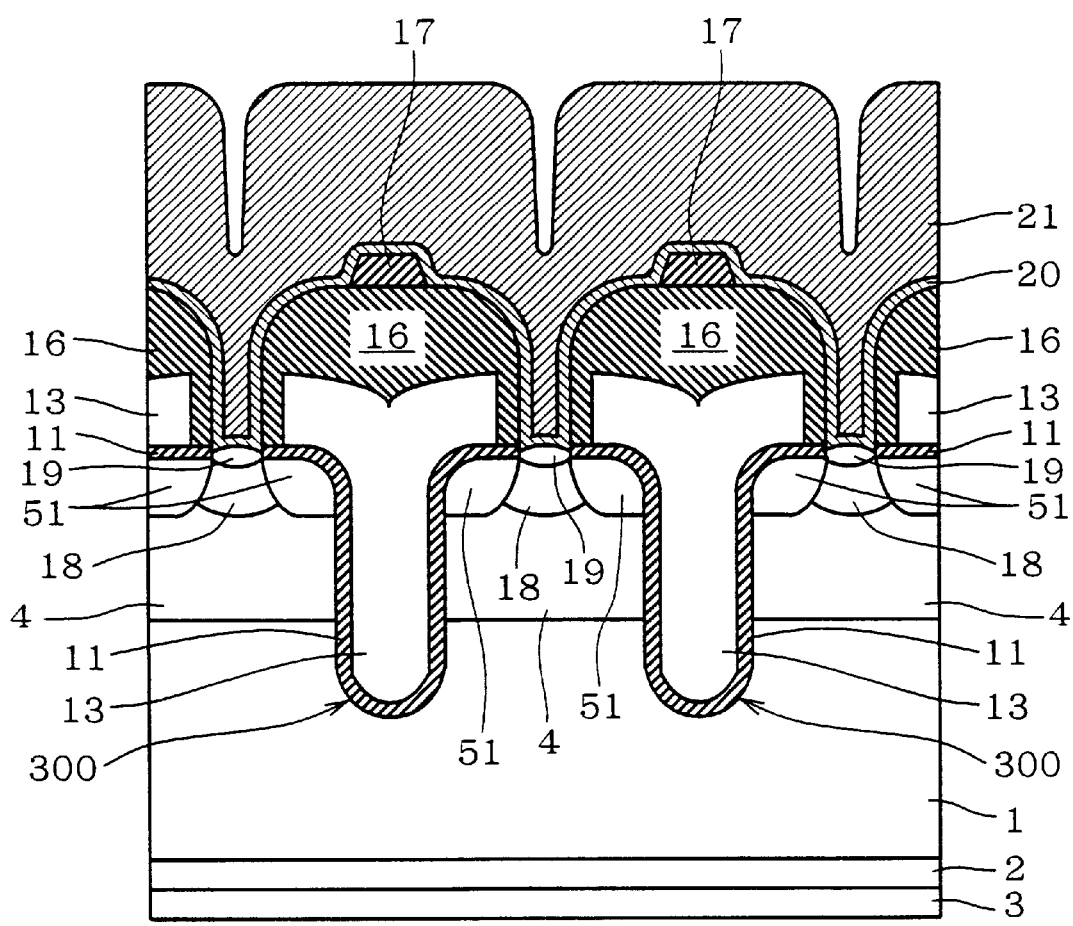

Thereafter P-type semiconductor layers 18 having a high impurity concentration are formed by ion implantation or the like from upper surface portions of the P-type base layer 4 exposed between the adjacent N⁺-type emitter diffusion layers 51 (FIG. 14). Further, interlayer isolation films 16 and 17 are deposited in this order by CVD, for example (FIG. 15). The interlayer isolation films 16 and 17 are selectively etched for leaving the same only on the gate electrodes 13, as shown in FIG. 16. Further, silicide layers 19 are formed on upper surfaces of the N⁺-type emitter diffusion layers 51, the P-type semiconductor layers 18 and the gate electrodes 13 by sputtering or lamp annealing, and a barrier metal layer 20 and an aluminum interconnect line 21 are deposited on the overall surface (FIG. 17). The aluminum interconnect line 21. is prepared from AlSi, AlSiCu or AlCu, for example.

For example, Japanese Patent Laying-Open Gazette No. 8-23092 (1996) discloses such a structure that the portions of the gate electrodes 13 projecting upward beyond the trenches 300 are larger in width than the trenches 300. However, the present invention has such an advantage that the characteristics of the gate oxide film 11 are improved by maintaining the relation of at least either $W_G \geq 1.3 \cdot W_T$ or $W_C \geq 0.2$ μm.

Figure 18:
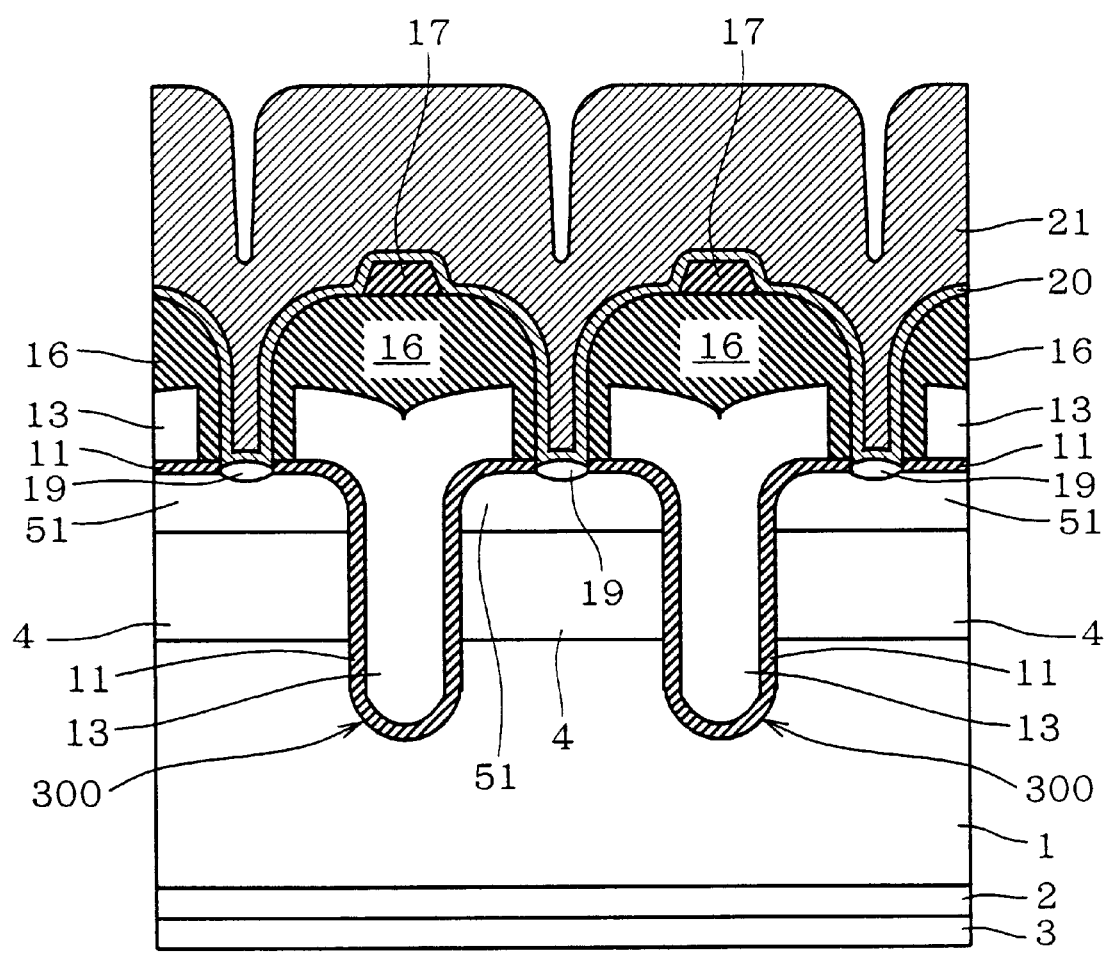
FIG. 18 is a sectional view showing a section parallel to that shown in FIG. 17.
Figure 19:
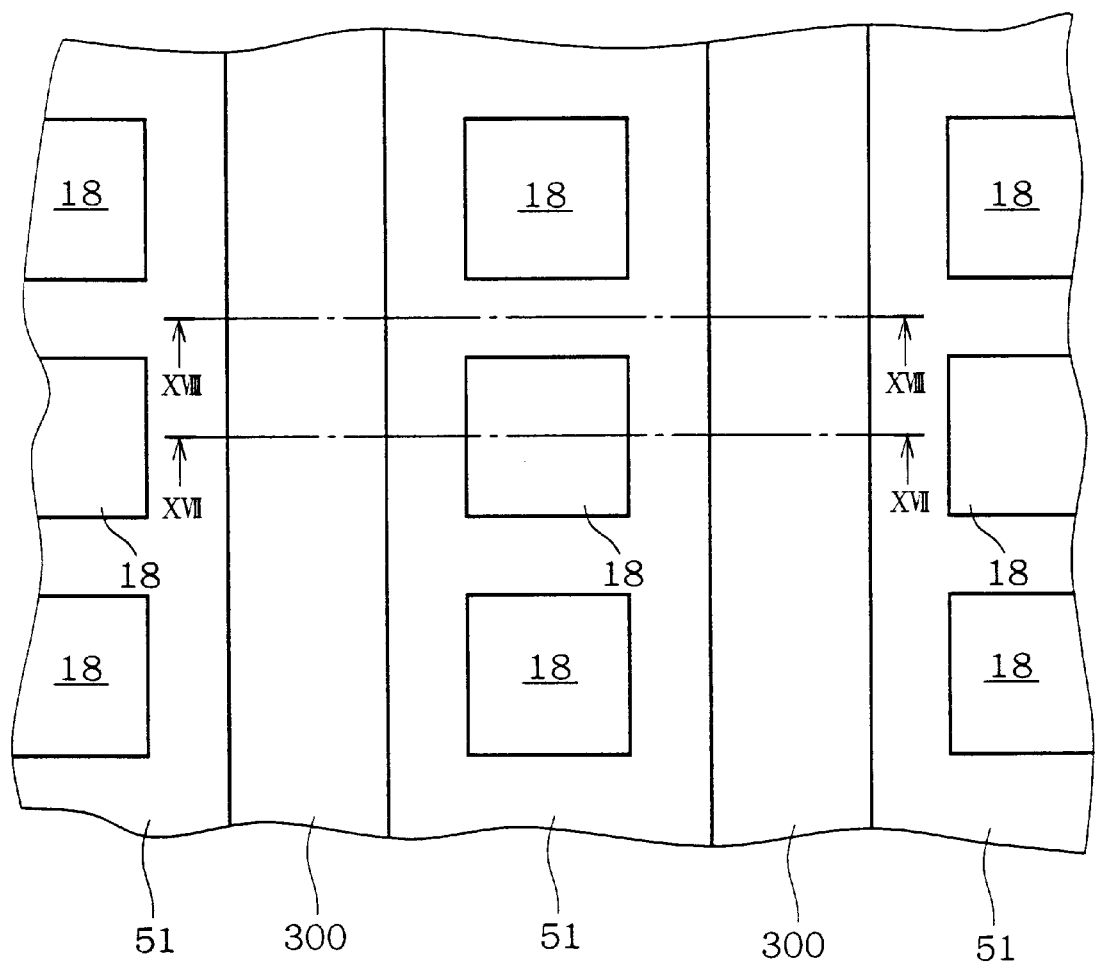
FIG. 19 is a top plan view showing a structure cut along a prescribed plane.

In the section shown in FIG. 17, the barrier metal layer 20 is not necessarily in contact with the $N^+$-type emitter diffusion layers 51 if the dimension $W_C$ is large. However, the aluminum interconnect line 21 and the $N^+$-type emitter diffusion layers 51 can be connected with each other in other portions. FIG. 18 shows a section in another position which is parallel to the section shown in FIG. 17. FIG. 19 is a sectional view taken along a plane perpendicular to the substrate depth direction in positions provided with the $N^+$-type emitter diffusion layers 51 in the structure shown in FIGS. 17 and 18. Neglecting the structure above the positions provided with the $N^+$-type emitter diffusion layers 51, sections taken along the lines XVII—XVII and XVIII—XVIII in FIG. 19 correspond to those shown in FIGS. 17 and 18 respectively. The lines XVII—XVII and XVIII—XVIII correspond to the lines IV—IV and V—V shown in FIG. 3 respectively.

In the section shown in FIG. 18, the $N^+$-type diffusion layers 5 are formed to cover the overall upper surface of the P-type base layer 4, as shown in FIG. 5. In this section, therefore, no P-type semiconductor layers 18 are formed but the $N^+$-type emitter diffusion layers 51 are continuous between the adjacent trenches 300, and the aluminum interconnect line 21 is connected with the $N^+$-type emitter diffusion layers 51 through the silicide layers 19 and the barrier metal layer 20.

Figure 20:
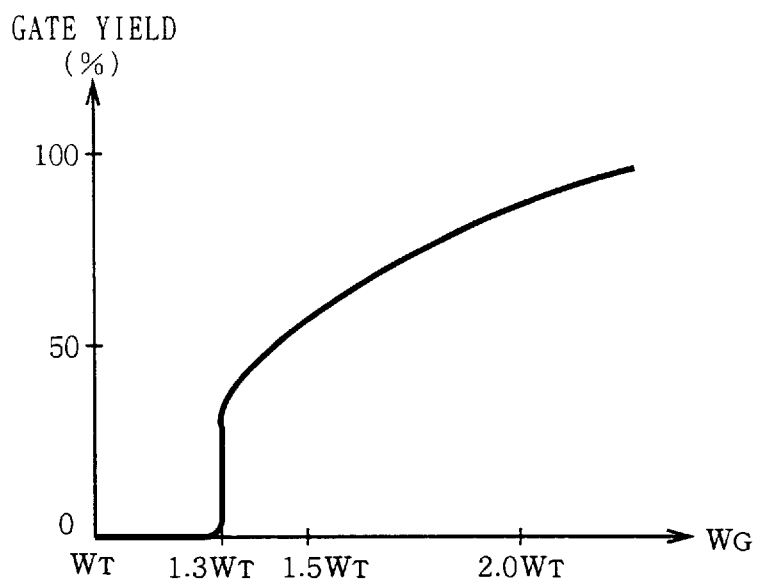
FIG. 20 is a graph showing influence exerted by a dimension $W_G$ on the yield of a trench MOS gate.
Figure 21:
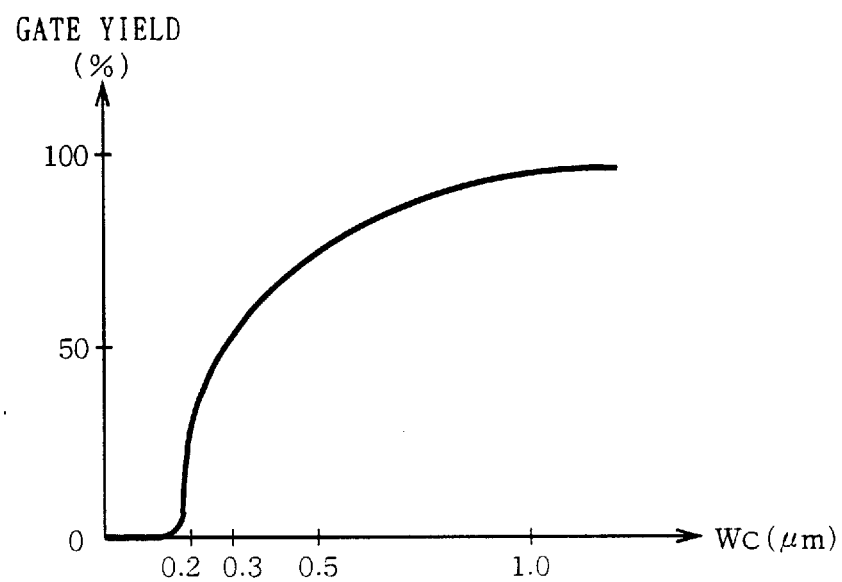
FIG. 21 is a graph showing influence exerted by a dimension $W_C$ on the yield of the trench MOS gate.

FIGS. 20 and 21 are graphs showing influences exerted by the dimensions $W_G$ and $W_C$ on the yield of trench MOS gates. As to the yield, trench MOS gates causing dielectric breakdown with application of a voltage below a certain reference voltage level or those developing leakage currents exceeding a certain reference current level are decided as defective, for example. It is understood from FIGS. 20 and 21 that the yield is remarkably improved from $W_G=1.3 \cdot W$ and from $W_C=0.2$ μm respectively.

While the detail of the reason why the yield is thus improved is unknown, the first cause may be that the trenches are formed in order of 302, 301 and 300 and the corners of the openings and the bottom portions of the trenches are rounded. Thus, it is estimable that dielectric breakdown or leakage is hardly caused due to the shape of the gate oxide film 11 since distribution of electric fields applied between the gate electrodes 13 and the P-type base layer 4 can be prevented from being locally increased and the gate oxide film 11 can be substantially homogeneously formed between the inner walls of the trenches 300 and the upper surface of the P-type base layer 4.

The second cause may be that the trench openings are weak spots with respect to the gate oxide film characteristics in the trench MOS gate structure as described above and hence portions of the gate oxide film 11 close to the openings of the trenches 300 are not exposed to etching on the polycrystalline silicon film 12 for forming the gate electrodes 13 when the dimensions $W_C$ and $W_G$ are increased, and the gate oxide film characteristics are prevented from deterioration caused by plasma damage. Namely, it is estimable that dielectric breakdown, leakage or deterioration of the gate oxide film characteristics such as reliability is hardly caused since the gate oxide film 11 is not etched.

According to this embodiment, as hereinabove described, the gate oxide film of the trench MOS gates can be improved in shape as well as film quality. Thus, it is conceivable that this embodiment improves the characteristics of the gate oxide film as well as the yield of the trench MOS gates.

Figure 44:
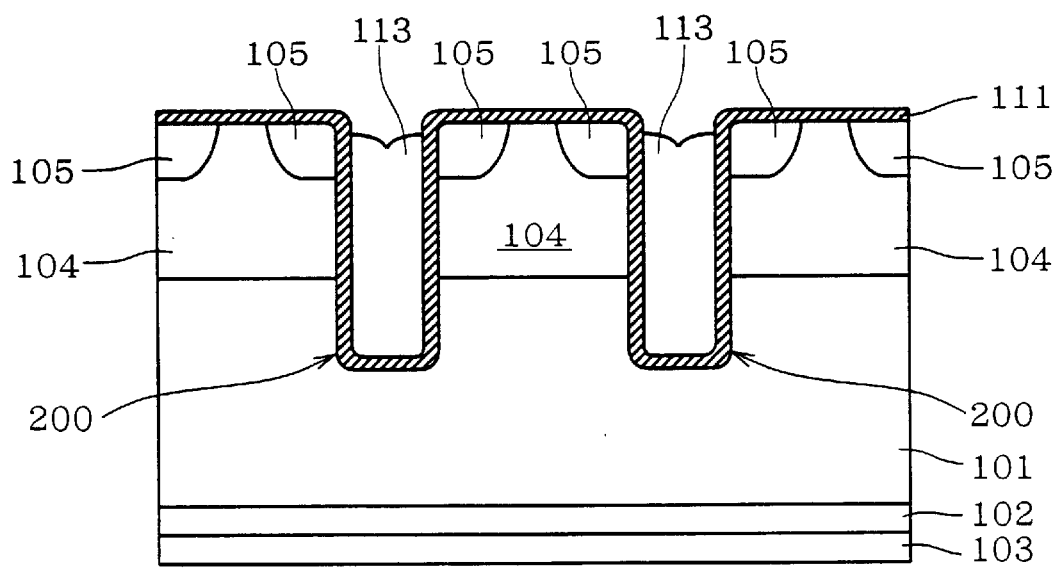
Figure 45:
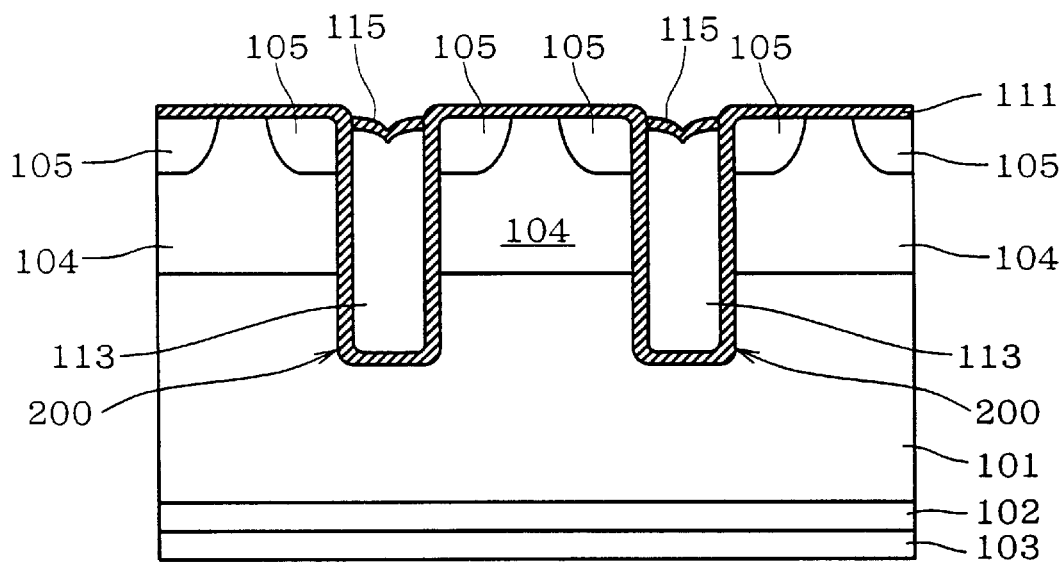
Figure 46:
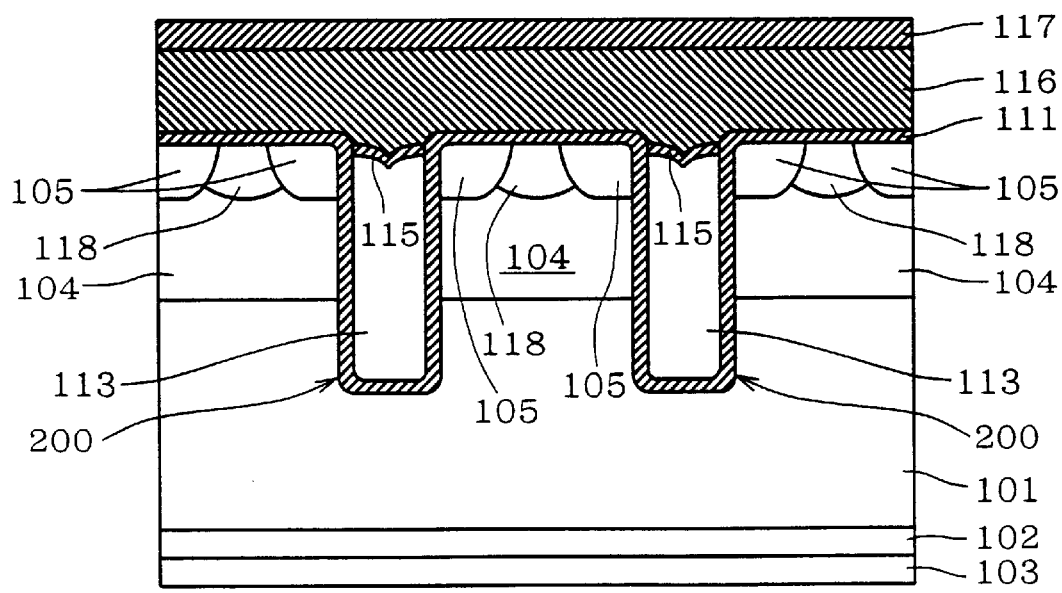
Figure 47:
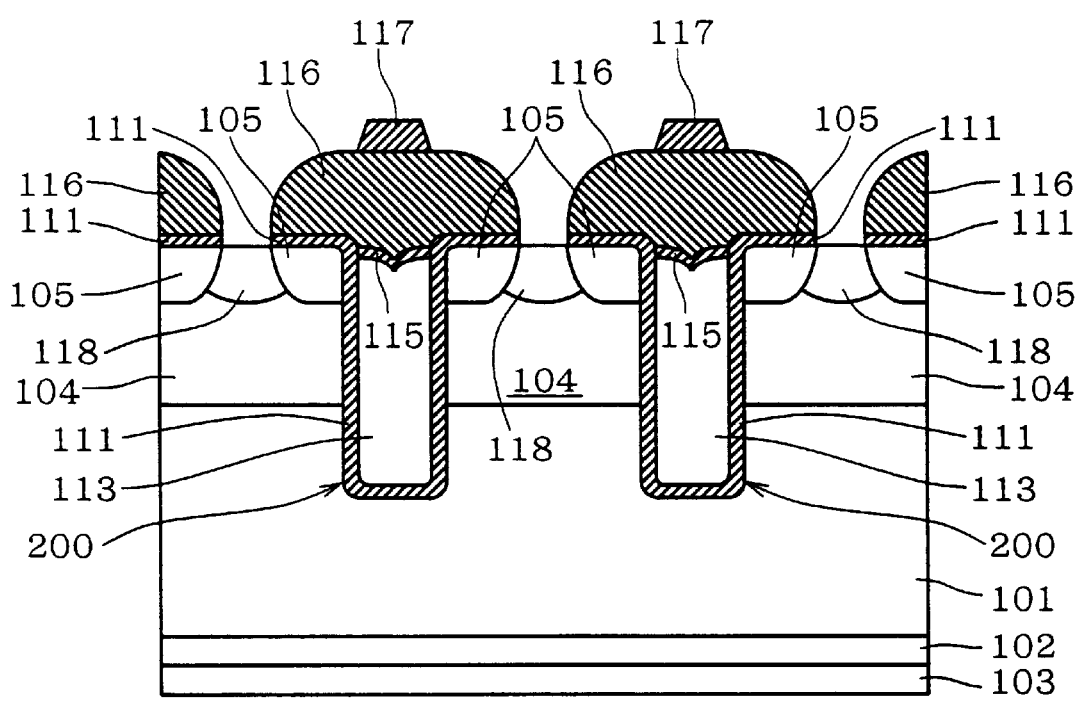
Figure 48:
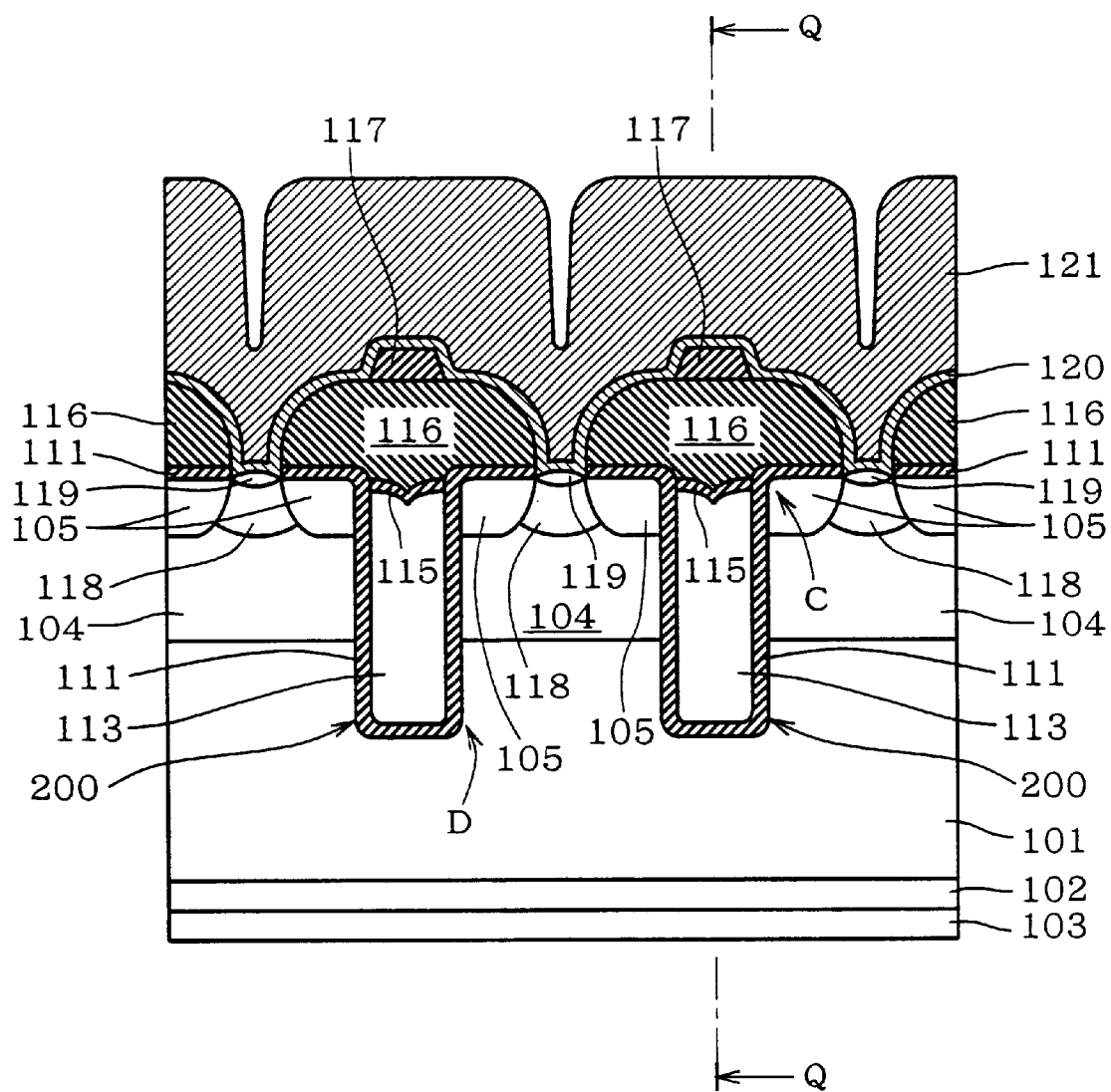

In order to reduce the gate resistance, silicide layers of TiSi, CoSi or the like, for example, may be formed on surfaces of the gate electrodes 13. Alternatively, the surfaces of the gate electrodes 13 may be oxidized in steps similar to those shown in FIGS. 44 and 45. In this case, however, there is such a possibility that an impurity (e.g., phosphorus) contained in the gate electrodes 13 is oxidized to cause segregation to the interfaces between the gate oxide film 11 and the gate electrodes 13 or the grain boundaries of the gate electrodes 13 are oxidized to form an oxide of the impurity, to readily deteriorate the gate oxide film characteristics.

Embodiment 2

Figure 22:
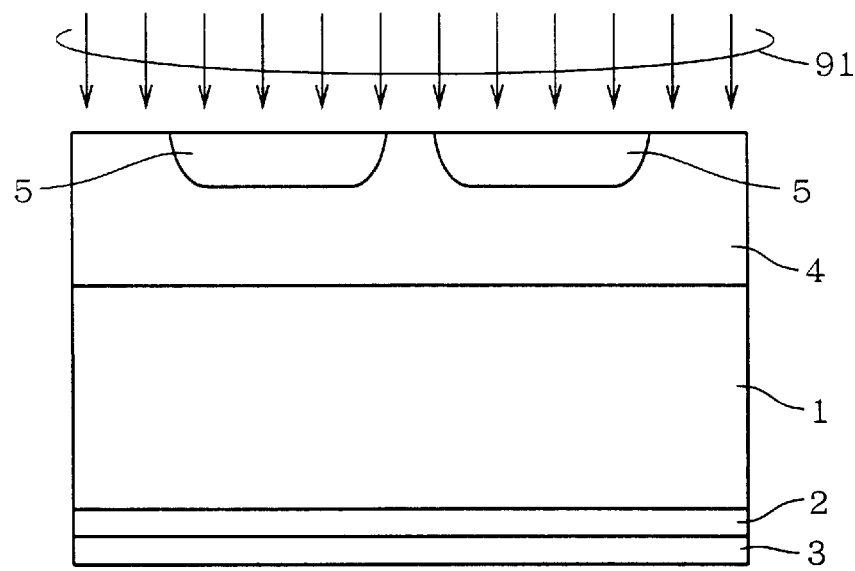
FIGS. 22 and 23 are sectional views showing an embodiment 2 of the present invention in step order.
Figure 23:
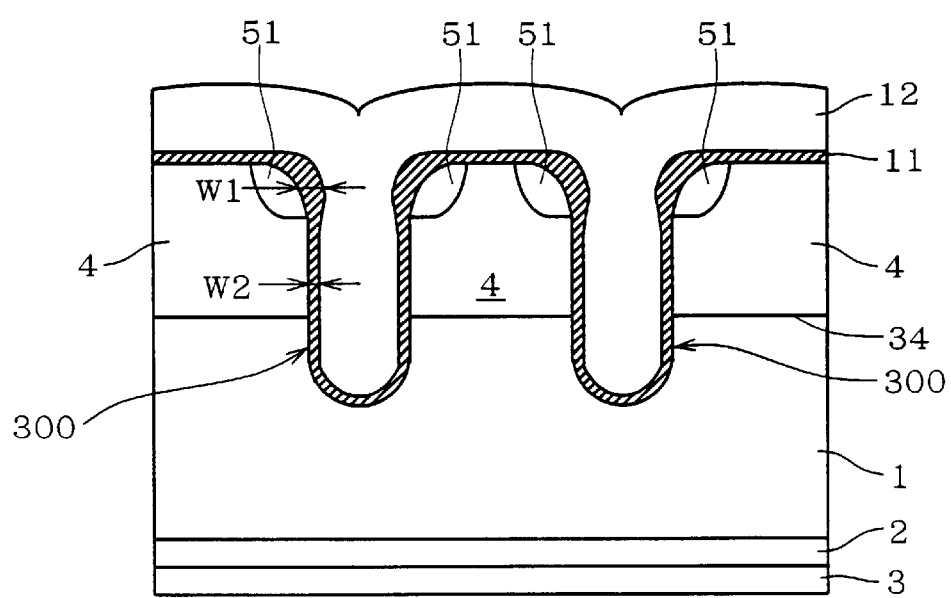

FIGS. 22 and 23 are sectional views showing a method of fabricating an IGBT according to an embodiment 2 of the present invention in step order. First, a structure similar to that shown in FIG. 4 is obtained through steps similar to those shown in the embodiment 1. Thereafter silicon ions 91 are implanted from above a P-type base layer 4 and $N^-$-type diffusion layers 5 (FIG. 22). Then, steps similar to those shown in FIGS. 6 to 12 are carried out, thereby obtaining the structure shown in FIG. 23.

Referring to FIG. 23, a gate oxide film 11 is different in thickness from those shown in FIG. 12. The thickness W1 of the gate oxide film 11 along a transverse direction perpendicular to the thickness direction of the P-type base layer 4 in positions provided with $N^+$-type emitter diffusion layers 51 around openings of trenches 300, i.e., the depth from an upper surface of the P-type base layer 4, and the thickness W2 along the transverse direction in inner wall portions of the trenches 300 such as positions adjacent to the P-type base layer 4, for example, are in relation of $W1 \geq 1.3 \cdot W2$.

Thus, the portions of the gate oxide film 11 located on the openings of the trenches 300 developing strong electric fields can be increased in thickness while reducing the portions of the gate oxide film 11 in thickness, facing portions of the P-type base layer 4, forming channels, close to the trenches 300 held between the $N^+$-type emitter diffusion layers 51 and an $N^-$-type semiconductor layer 1, whereby it is possible to suppress dielectric breakdown of the gate oxide film 11 without damaging characteristics of forming channels.

Japanese Patent Laying-Open Gazette No. 7-249769 (1995) discloses a technique of increasing the thickness of a gate oxide film in portions on openings by oxidizing impurity diffusion layers simultaneously formed with emitter diffusion layers in portions which are close to openings of trenches and not provided with emitter diffusion layers. According to the present invention, however, the $N^+$-type emitter diffusion layers 51 are provided on the openings of the trenches 300, whereby the thickness of the gate oxide film 11 can be increased in the portions, in addition to the effect disclosed in this gazette.

According to the present invention, the $N^+$-type emitter diffusion layers 51 are brought into an amorphous state due to implantation of the silicon ions 91. The thickness of the portions of the gate oxide film 11 obtained by oxidizing the amorphous $N^+$-type emitter diffusion layers 51 is increased beyond that of the portions of the gate oxide film 11 obtained by oxidizing portions of the $N^-$ type semiconductor layer 1 and the P-type base layer 4 exposed on the inner walls of the trenches 300. As compared with the case of simply increasing the thickness of the portions of the gate oxide film close to the trench openings by the technique disclosed in Japanese Patent Laying-Open Gazette No. 7-249769, therefore, the yield of trench MOS gates can be further improved in the present invention.

Due to implantation of the silicon ions 91, further, secondary defects such as dislocation loops are formed in the vicinity of the range thereof. These secondary defects serve as gettering sites with respect to microdefects caused in formation of the trenches 300 in the P-type base layer 4. The microdefects have a function of increasing a leakage current flowing in reverse-biasing in a junction formed between the N⁻-type semiconductor layer 1 and the P-type base layer 4. According to this embodiment, therefore, such leakage current can be suppressed.

Figure 24:
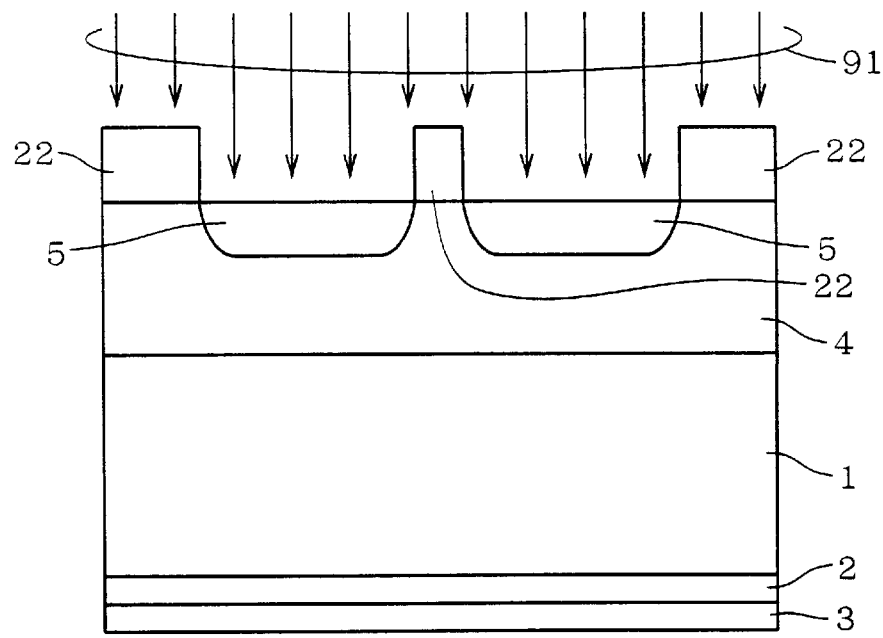
FIG. 24 is a sectional view showing a modification of the embodiment 2 of the present invention.

FIG. 24 is a sectional view showing a modification of this embodiment. Silicon ions 91 may be implanted not into both of a P-type base layer 4 and N⁺-type emitter diffusion layers 5 but only into the N⁺-type diffusion layers 5, dissimilarly to the embodiment shown in FIG. 22. This is because the aforementioned effect is attained when only N⁺-type emitter diffusion layers 51 close to openings of trenches 300 are brought into an amorphous state. Therefore, the silicon ions 91 may be implanted through a mask 22 exposing the N⁺-type diffusion layers 5 while covering the P-type base layer 4.

Embodiment 3

Figure 25:
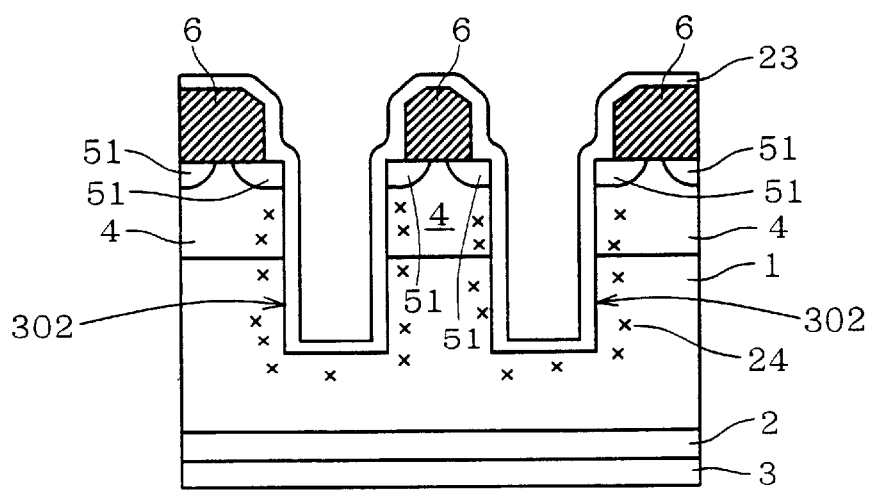
FIGS. 25 and 26 are sectional views showing an embodiment 3 of the present invention in step order.
Figure 26:
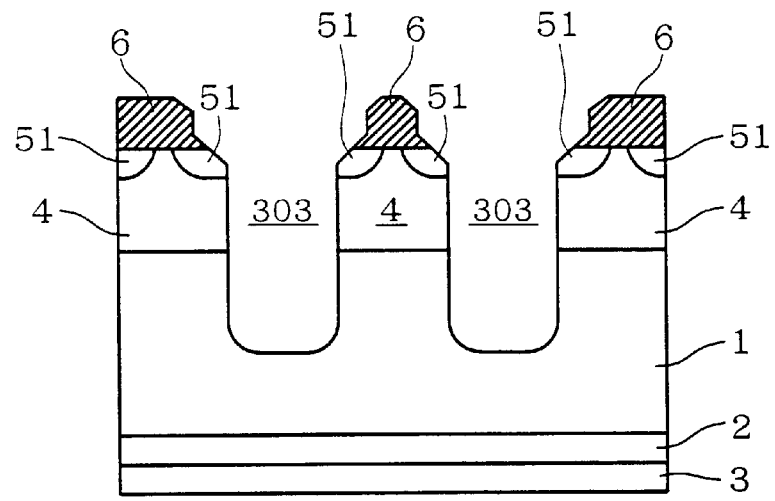

FIGS. 25 and 26 are sectional views showing a method of fabricating an IGBT according to an embodiment 3 of the present invention in step order. First, a structure similar to that shown in FIG. 8 is obtained through steps similar to those in the embodiment 1. A non-doped amorphous silicon layer 23 is deposited on a region (including inner walls of trenches 302) exposed on this structure (FIG. 25).

The amorphous silicon layer 23 serves as a gettering material for microdefects 24 caused in an N⁻-type semiconductor layer 1 and a P-type base layer 4 around the trenches 302 resulting from formation thereof. Therefore, the microdefects 24 can be reduced by further isotropically etching the silicon and removing the amorphous silicon layer 23. At this time, corners of N⁺-type emitter diffusion layers 51 provided on openings of the trenches 302 and portions of the P-type base layer 4 located on bottom portions of the trenches 302 are rounded to define trenches 303 (FIG. 26).

Thereafter trench MOS gates are formed through steps similar to those of the embodiment 1 shown in FIGS. 10 to 17, to be capable of inhibiting the microdefects 24 from exerting bad influence on formation of a gate oxide film 11. Therefore, mobility in channel regions of transistors employing the trench MOS gates and leakage characteristics in main junctions can be improved.

A similar effect can be attained by depositing a non-doped polycrystalline silicon layer in place of the amorphous silicon layer 23.

Further, a similar effect can be attained by carrying out an annealing step immediately after a step similar to that of the embodiment 1 shown in FIG. 8, without depositing the amorphous silicon layer 23 in particular. Damages applied to the N⁻-type semiconductor layer 1 and the P-type base layer 4 in formation of the trenches 302 can be concentrated to portions close to the inner walls of the trenches 302 by annealing, to be removed by formation and removal of a sacrifice oxide film 10 similar to those in the embodiment 1 shown in FIGS. 10 and 11.

Embodiment 4

Figure 27:
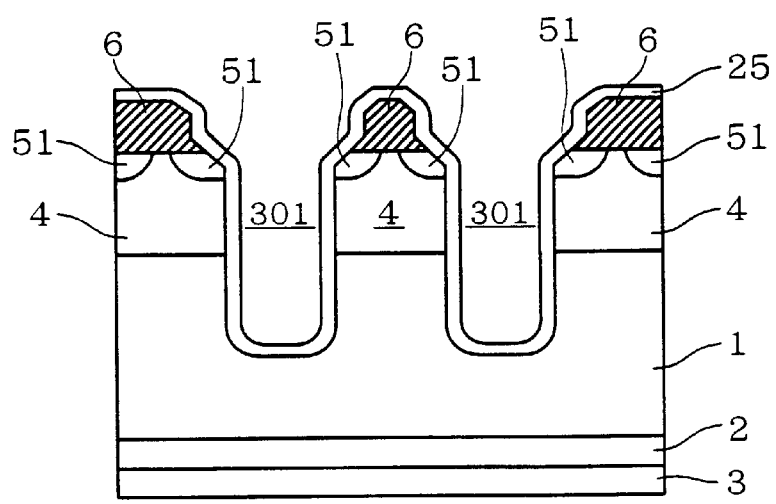
FIGS. 27 and 28 are sectional views showing an embodiment 4 of the present invention in step order.
Figure 28:
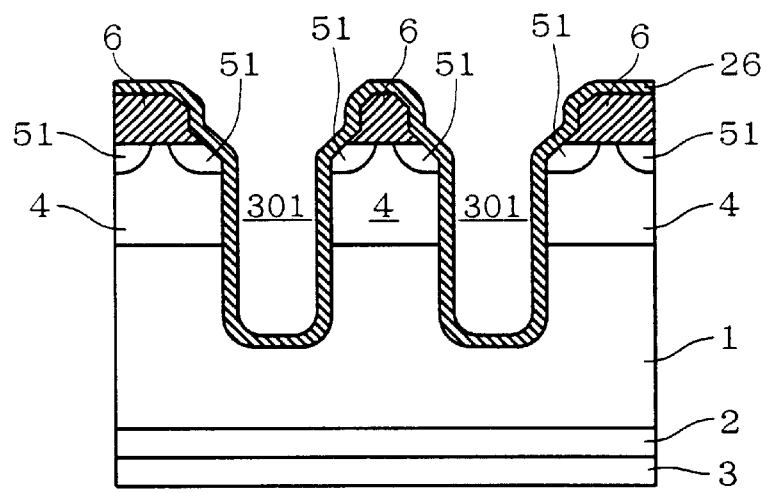

FIGS. 27 and 28 are sectional views showing a method of fabricating an IGBT according to an embodiment 4 of the present invention in step order. First, a structure similar to that shown in FIG. 9 is obtained through steps similar to those in the embodiment 1. A non-doped amorphous silicon layer 25 is deposited on a region (including inner walls of trenches 301) exposed on this structure (FIG. 27).

The amorphous silicon layer 25 serves as a gettering material for microdefects 24 caused in an N⁻-type semiconductor layer 1 and a P-type base layer 4, similarly to the amorphous silicon layer 23 shown in the embodiment 3. When the amorphous silicon layer 25 is thereafter removed, therefore, the microdefects 24 are reduced.

The amorphous silicon layer 25 is oxidized to form a sacrifice oxide film 26 (FIG. 28). Thereafter the sacrifice oxide film 26 is removed through steps similar to those of the embodiment 1 shown in FIGS. 1. to 17 to form trench MOS gates, to be capable of inhibiting the microdefects 24 from exerting bad influence on formation of a gate oxide film 11. Therefore, mobility in channel regions of MOS transistors and leakage characteristics in main junctions can be improved.

A similar effect can be attained by depositing a non-doped polycrystalline silicon layer in place of the amorphous silicon layer 25, similarly to the embodiment 3. Further, a similar effect can be attained by carrying out an annealing step immediately after a step similar to that of the embodiment 1 shown in FIG. 9, without depositing the amorphous silicon layer 25 in particular. Damages applied to the N⁻-type semiconductor layer 1. and the P-type base layer 4 can be concentrated to portions close to the inner walls of the trenches 302 by annealing performed in advance of formation and removal of the sacrifice oxide film 26, similarly to the embodiment 3.

Embodiment 5

Figure 29:
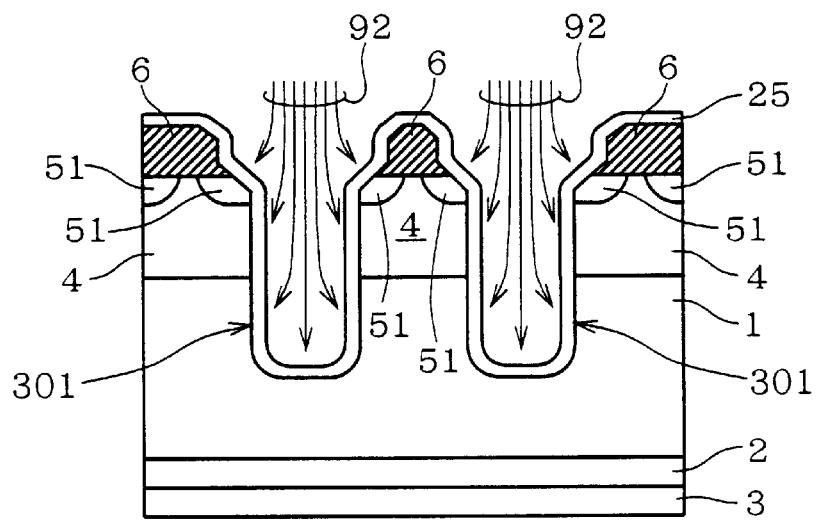
FIG. 29 is a sectional view showing an embodiment 5 of the present invention.

FIG. 29 is a sectional view showing a method of fabricating an IGBT according to an embodiment 5 of the present invention. First, a structure similar to that shown in FIG. 27 is obtained through steps similar to those in the embodiments 1 and 3. Thereafter nitrogen ions 92 are implanted into a non-doped amorphous silicon layer 25, which is deposited at least on inner walls of trenches 301 (FIG. 29). Annealing is so performed that the nitrogen ions 92 implanted into the amorphous silicon layer 25 diffuse into portions of an N⁻-type semiconductor layer 1 and a P-type base layer 4 around the trenches 301.

Thereafter the amorphous silicon layer 25 is oxidized to form an oxide film 26 similar to that shown in FIG. 28, and the oxide films 26 and 6 are removed to obtain a structure similar to that of the embodiment 1 shown in FIG. 11. Nitrogen is present in the portions of the N⁻-type semiconductor layer 1 and the P-type base layer 4 around trenches 300. When a gate oxide film 11 is formed by oxidation through a step similar to that of the embodiment 1 shown in FIG. 12 and a polycrystalline silicon film 12 for gate electrodes is deposited, therefore, it comes to that nitrogen is present over interfaces between the formed gate oxide film 11 and the N⁻-type semiconductor layer 1. and the P-type base layer 4 and between the gate oxide film 11 and the polycrystalline silicon film 12 for gate electrodes.

This nitrogen is bonded with dangling bonds between the gate oxide film 11 and the N⁻-type semiconductor layer 1 and the P-type base layer 4 or occupies positions of crystal defects, thereby suppressing generation of interface levels. Assuming that the N⁻-type semiconductor layer 1 and the P-type base layer 4 are mainly composed of silicon, for example, Si—N bonds are formed in place of Si—H bonds or Si—PH bonds serving as electron traps in the gate oxide film 11. Thus, the electron traps in the gate oxide film 11 can be reduced.

Further, impurities are inhibited from diffusing into the gate oxide film 11 from the N⁻-type semiconductor layer 1 and the P-type base layer 4 or the polycrystalline silicon film 12.

Thus, the gate oxide film 11 is improved in reliability, and hot carrier resistance of transistors employing trench MOS gates and mobility of channel regions are also improved.

The nitrogen ions 92 may alternatively be implanted into a structure similar to that of the embodiment 1 shown in FIG. 10. Namely, nitrogen can be introduced into portions of an N⁻-type semiconductor layer 1 and a P-type base layer 4 around trenches 301 through a sacrifice oxide film 10 by implanting nitrogen ions 92 after formation of the sacrifice oxide film 10 (FIG. 30).

Figure 30:
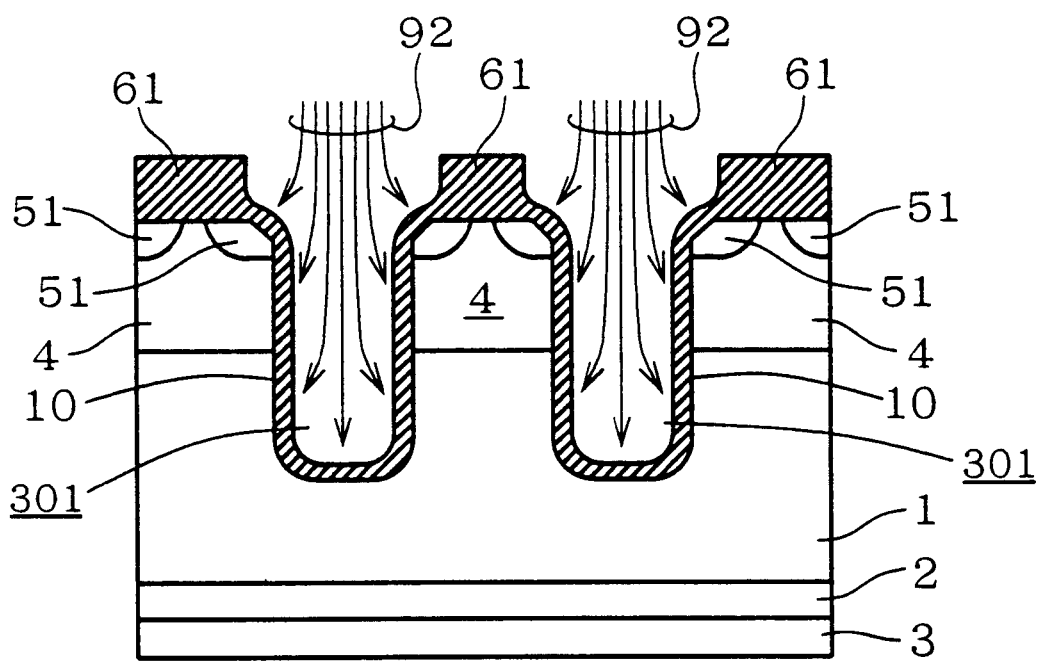
FIG. 30 is a sectional view showing a modification of the embodiment 5 of the present invention.

The nitrogen ions 92 can be implanted into the overall surface of each of the structures shown in FIGS. 29 and 30 from above. This is because regions to be provided with P-type semiconductor layers 18 (see FIG. 14 for the embodiment 1) formed later are covered with oxide films 6 and 61 which are set in large thicknesses for serving as masks in formation of trenches to be capable of inhibiting implantation of the nitrogen ions 92.

A similar effect can be attained by depositing a non-doped polycrystalline silicon layer in place of the amorphous silicon layer 25, similarly to the embodiments 3 and 4.

The nitrogen ions 92 are preferably implanted through the amorphous silicon layer 25, a sacrifice oxide film 10 or a polycrystalline silicon layer removed later as in this embodiment, as compared the technique of forming a gate oxide film from an oxide film into which nitrogen is ion-implanted as such as disclosed in Japanese Patent Laying-Open Gazette No. 7-130679 or the technique of implanting the nitrogen ions 92 directly into the N⁻-type semiconductor layer 1 and the P-type base layer 4, not to deteriorate characteristics of transistors including trench MOS gates or junction leakage.

Embodiment 6

Figure 31:
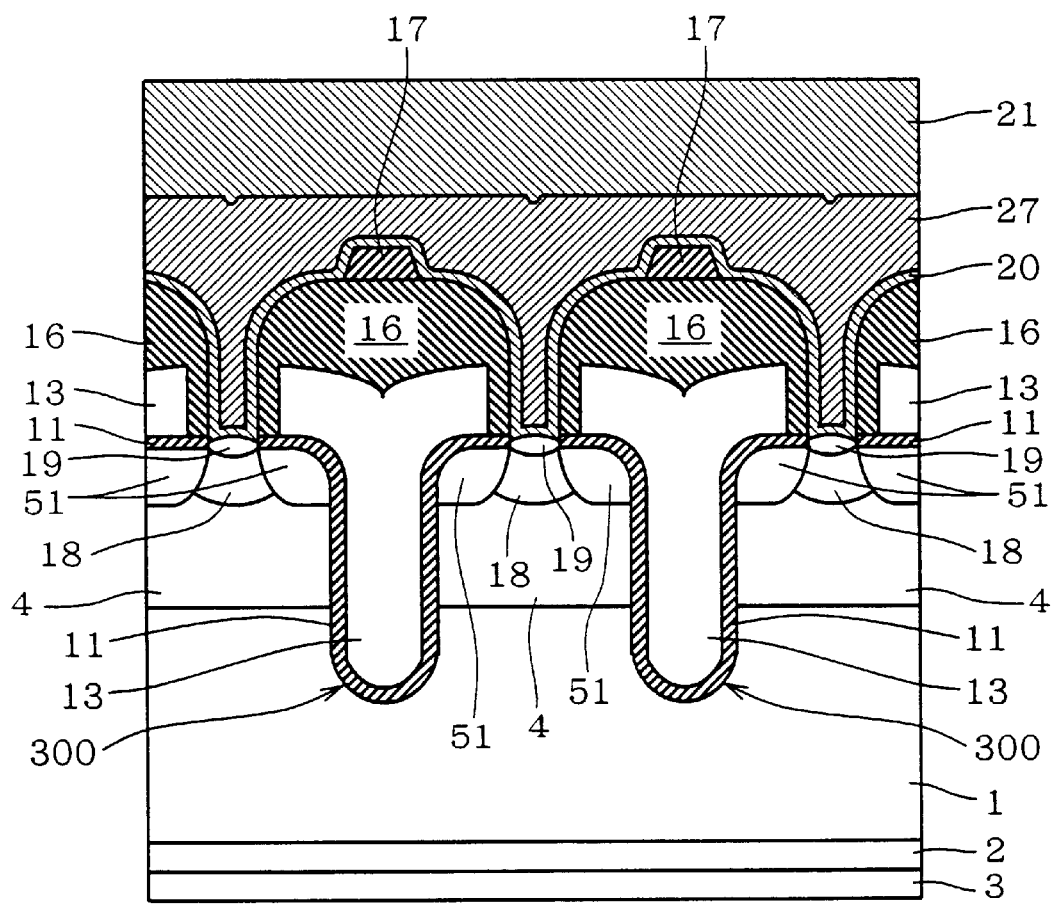
FIG. 31 is a sectional view showing an embodiment 6 of the present invention.

FIG. 31 is a sectional view showing a method of fabricating an IGBT according to an embodiment 6 of the present invention. First, a structure similar to that shown in FIG. 16 is obtained through steps similar to those in the embodiment 1. While a barrier metal layer 20 is thereafter deposited, a buffer layer 27 of tungsten or molybdenum, for example, having higher strength than aluminum is deposited on the barrier metal layer 20 in advance of deposition of an aluminum interconnect line 21. The thickness of the buffer layer 27 is set at a level not more than 40% of that of the aluminum interconnect line 21, for example.

Such a buffer layer 27 is interposed between the barrier metal layer 20 and the aluminum interconnect line 21 at least immediately above trench MOS gates, thereby improving flatness of the aluminum interconnect line 21. Thus, the trench MOS gates are prevented from breakage by a bonding impact in on-cell bonding, or apparent increase of resistance of transistors employing the trench MOS gates is prevented in ON states.

Embodiment 7

Figure 32:
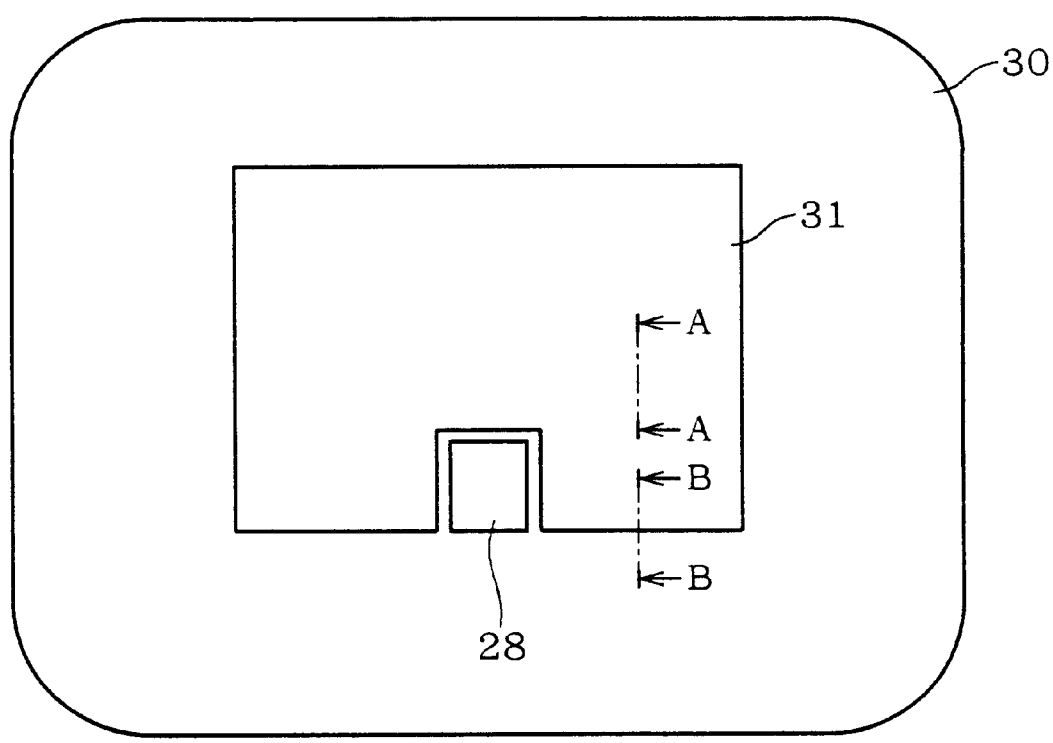
FIG. 32 is a plan view conceptually showing an embodiment 7 of the present invention.

FIG. 32 is a plan view conceptually showing the structure of an IGBT according to an embodiment 7 of the present invention. A chip periphery guard ring region 30 encloses an emitter pad 31 consisting of aluminum or an aluminum alloy and a gate pad 28.

Figure 33:
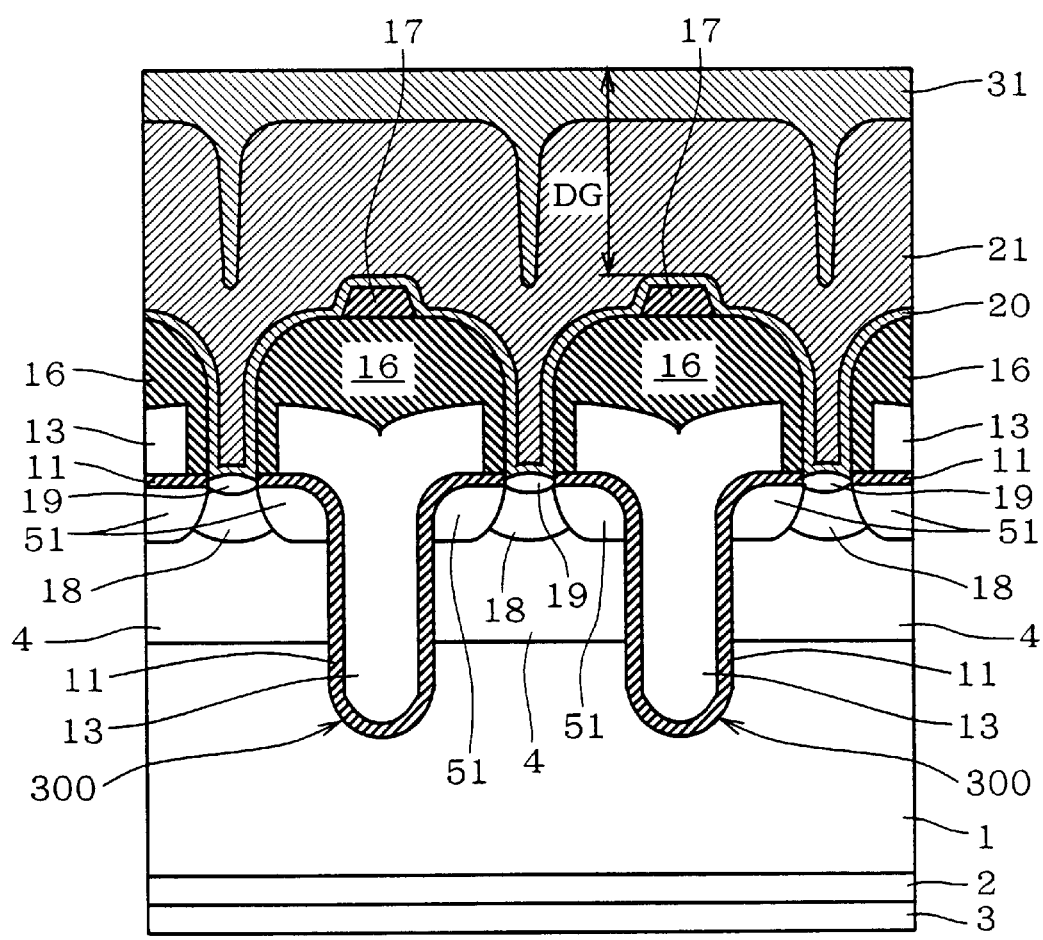
FIG. 33 is a sectional view taken along the line A—A in FIG. 32.
Figure 34:
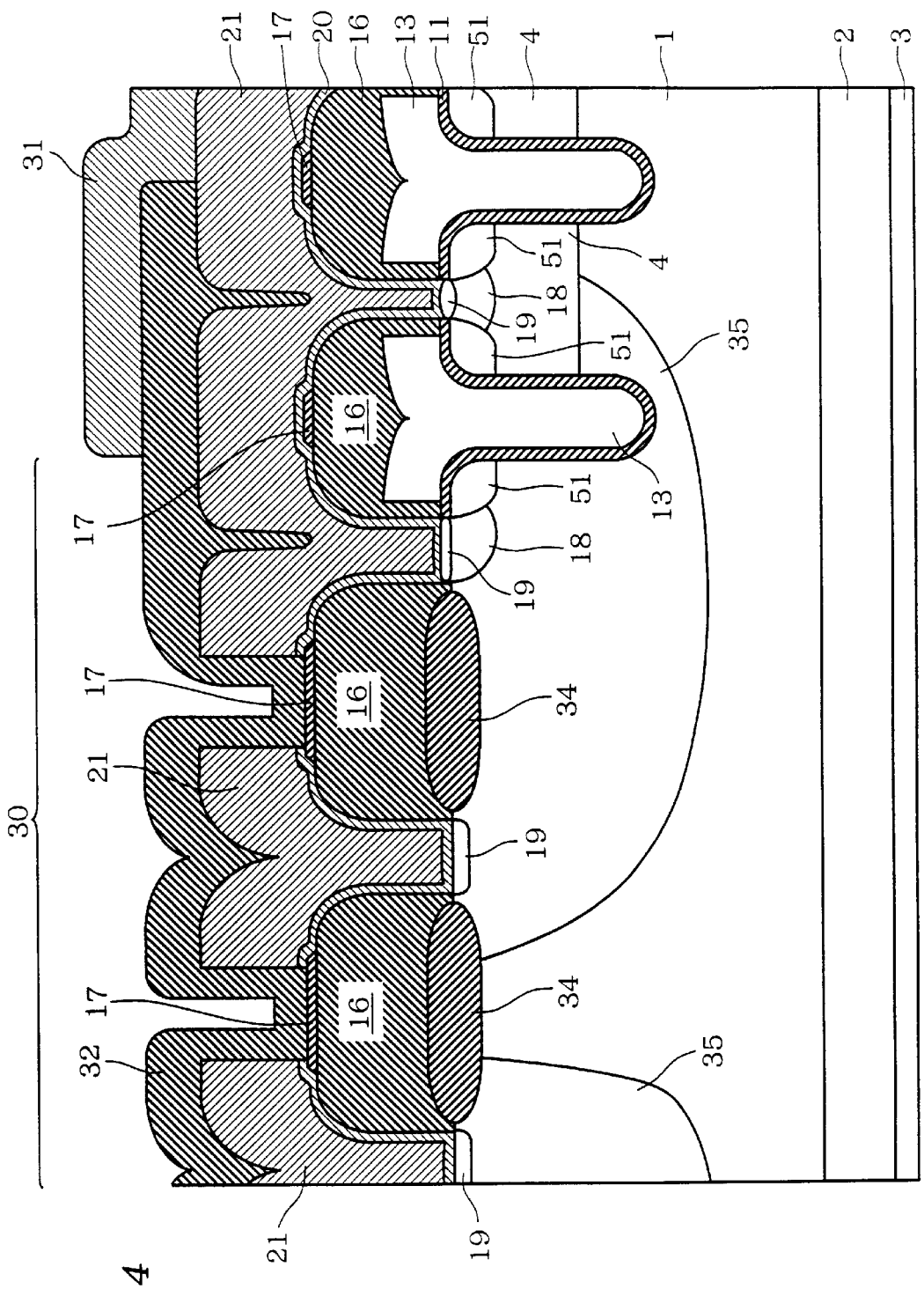
FIG. 34 is a sectional view taken along the line B—B in FIG. 32.

FIGS. 33 and 34 are sectional views taken along the lines A—A and B—B in FIG. 32 respectively. The emitter pad 31 conducts with N⁺-type emitter diffusion layers 51, while the gate pad 28 conducts with gate electrodes 13. In the section shown in FIG. 33, an aluminum interconnect line 21 is covered with the emitter pad 31, to increase the thickness DG of metal layers immediately above trench MOS gates (referring to FIG. 33, the total of the thicknesses of the aluminum interconnect line 21 and the emitter pad 31). Thus, the trench MOS gates can be prevented from breakage caused by an impact in on-cell bonding, similarly to the embodiment 6.

Figure 35:
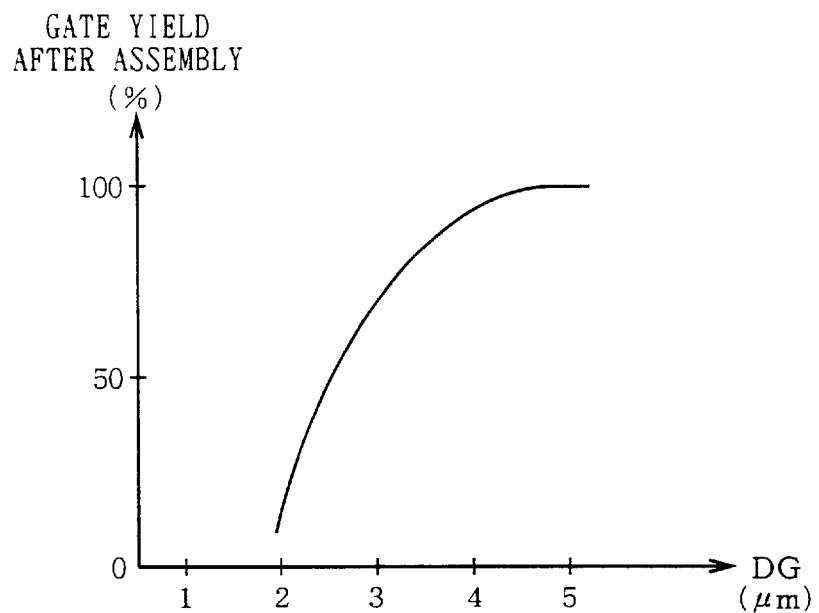
FIG. 35 is a graph showing the relation between a thickness DG and the yield of a trench MOS gate.

FIG. 35 is a graph showing the relation between the thickness DG and the yield of the trench MOS gates after an assembly step. It is understood that the yield is improved as the thickness of the metal layers immediately above the trench MOS gates is increased. The case of DG=5 μm corresponds to the case shown in FIG. 31.

Figure 36:
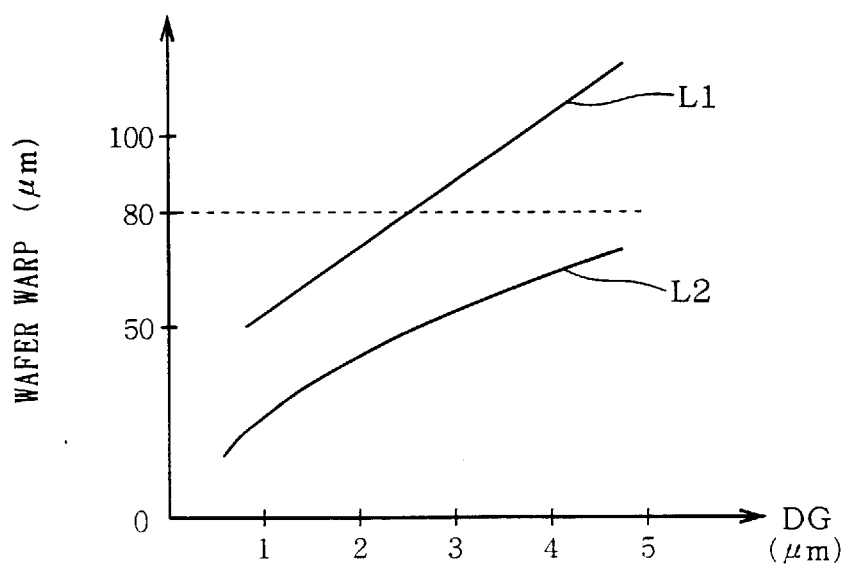
FIG. 36 is a graph showing the relation between the thickness DG and the amount of warping of a wafer provided with the trench MOS gate.

However, it is unpreferable to continuously form the aluminum interconnect line 21 immediately above the trench MOS gates integrally with the emitter pad 31. FIG. 36 is a graph showing the relation between the thickness DG and warp of a wafer provided with the trench MOS gates. Referring to FIG. 36, curves L1 and L2 show the cases of obtaining metal layers of the thickness DG by forming aluminum interconnect lines 21 and emitter lads 31 through a single film formation step and two film formation steps respectively. It is difficult to perform processing in an exposure unit if the wafer warps in excess of 80 μm. Therefore, it is advantageous to increase the thickness DG through two film formation steps, as compared with the case of increasing the thickness DG through a single film formation step.

The warp of the wafer can be suppressed even if the thickness DG is large by forming the aluminum interconnect line 21 and the emitter pad 31 independently of each other, since the area occupied by the aluminum interconnect line 21. on the wafer is reduced by patterning the aluminum interconnect line 21 before forming the emitter pad 31.

Figure 49:
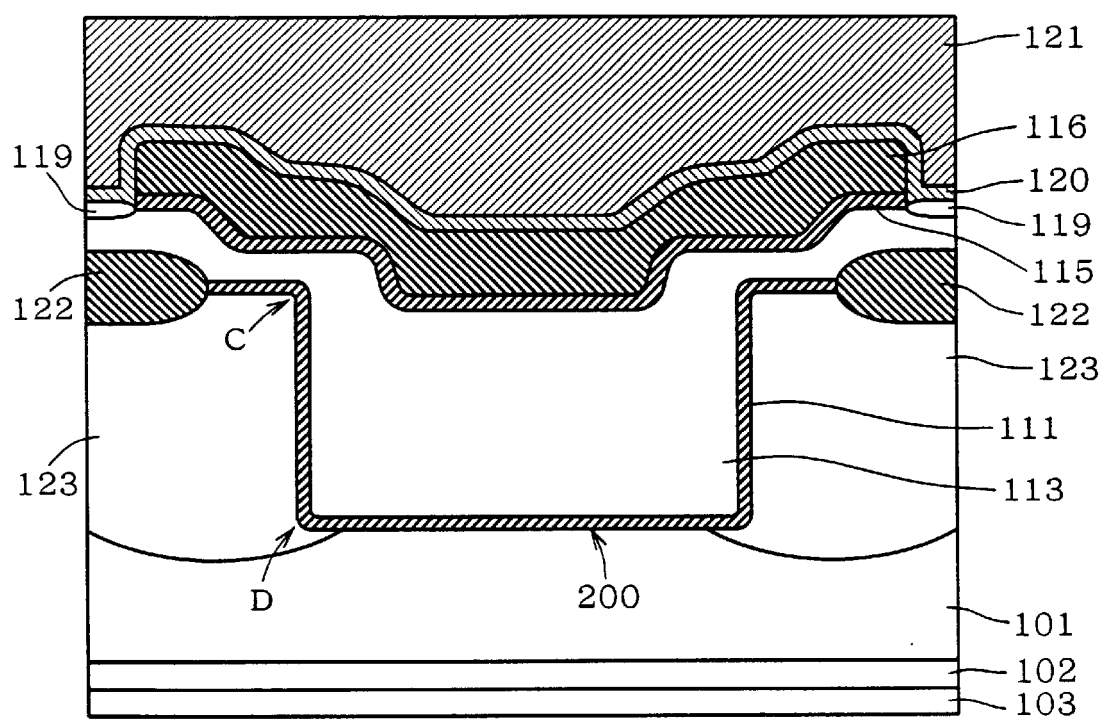
FIG. 49 is a sectional view taken along the line Q—Q in FIG. 48.

For example, the emitter pad 31. covers the aluminum interconnect line 21 in FIG. 34, and the aluminum layer 21 appearing in FIG. 34 is connected with the N⁺-type emitter diffusion layers 51. However, the aluminum interconnect line 21 is connected with the gate electrodes 13 in place of the N⁺-type emitter diffusion layers 51 in other portions, similarly to the aluminum interconnect line 121 shown in FIG. 49. Namely, the aluminum interconnect line 21 is classified into a first portion connected to the gate electrodes 13 and a second portion connected to the N⁺-type emitter diffusion layers 51 by the aforementioned patterning.

An interlayer insulating film 32 is provided on the first portion of the aluminum interconnect line 21 connected to the gate electrodes 13 in a section not appearing in FIG. 34, in order to prevent shorting by not being in contact with the emitter pad 31. This interlayer insulating film 32 appears in FIG. 34.

In the chip periphery guard ring region 30, isolation oxide films 34 are formed under interlayer isolation films 16 and 17, in place of trenches 300. Further, deep P-type diffusion layers 35 are formed in the vicinity of boundaries between the chip periphery guard ring region 30 and trench MOS gates.

Modifications

The present invention is not restricted to the structures of the IGBTs shown in the aforementioned embodiments. FIG.

Figure 37:
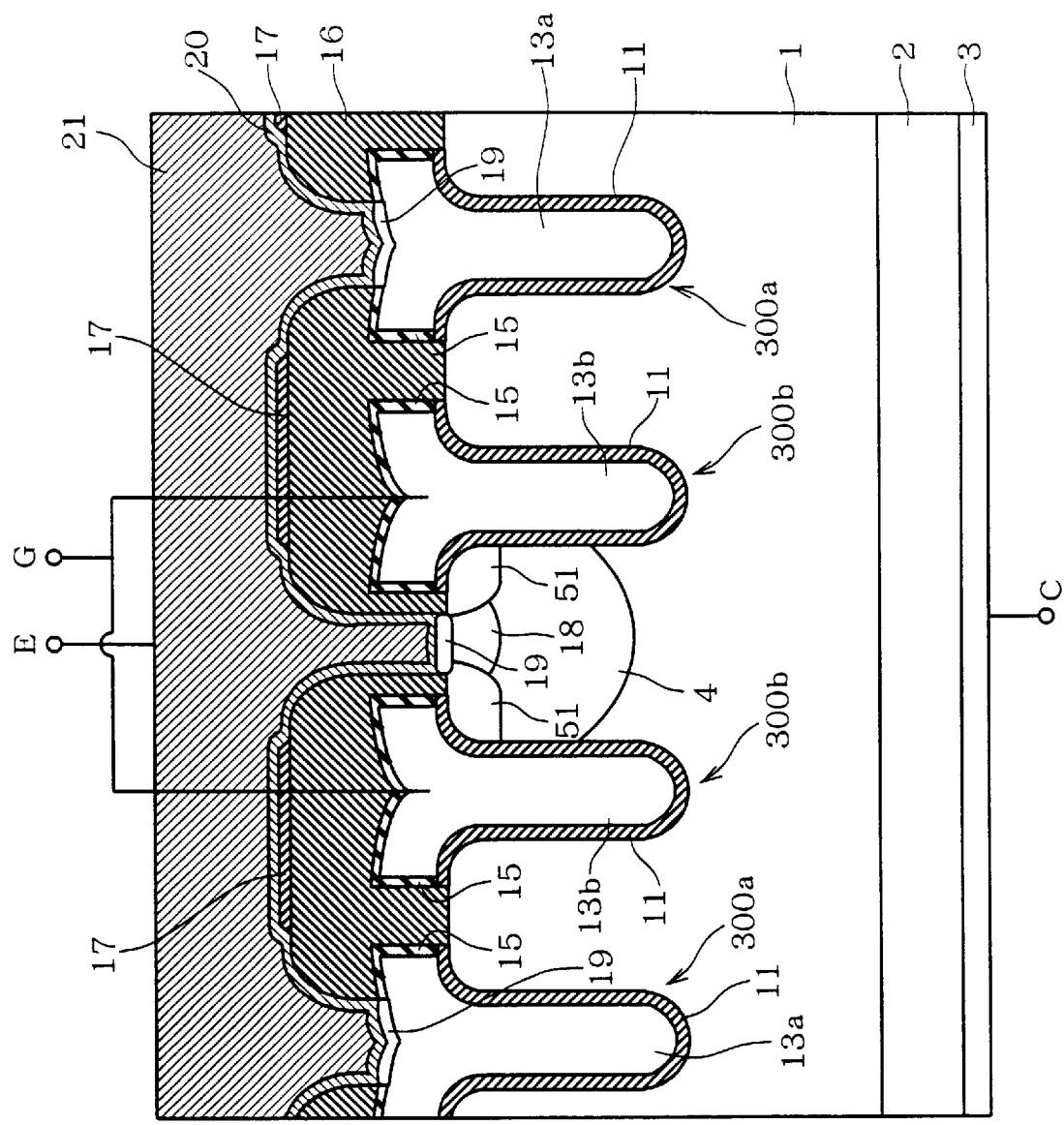

37 is a sectional view showing the structure of a further element to which the present invention is applicable. Referring to FIG. 37, trenches 300a and 300b are formed similarly to the trenches 300. The trenches 300a include polycrystalline silicon films 13a formed similarly to gate electrodes 13 and gate oxide films 11. The trenches 300b include gate electrodes 13b and gate oxide films 11. While the trenches 300b are adjacent to a P-type base layer 4 and N$^+$-type emitter diffusion layers 51, the trenches 300a are not adjacent to these impurity diffusion layers. While oxide films 15 are formed on surfaces of both of the polycrystalline silicon films 13a and the gate electrodes 13b, the polycrystalline silicon films 13a are connected with an aluminum interconnect line 21 through a barrier metal layer 20 and a silicide layer 19 through partial openings of the oxide films 15.

Therefore, the polycrystalline silicon films 13a are at a potential equal to that of emitters, and electrically isolated from the gate electrodes 13b. The structure described in FIG. 37 can be usefully employed to restrain increase of gate capacity which is the disadvantage of the trench MOS gate device, and to decrease gate capacity.

Figure 38:
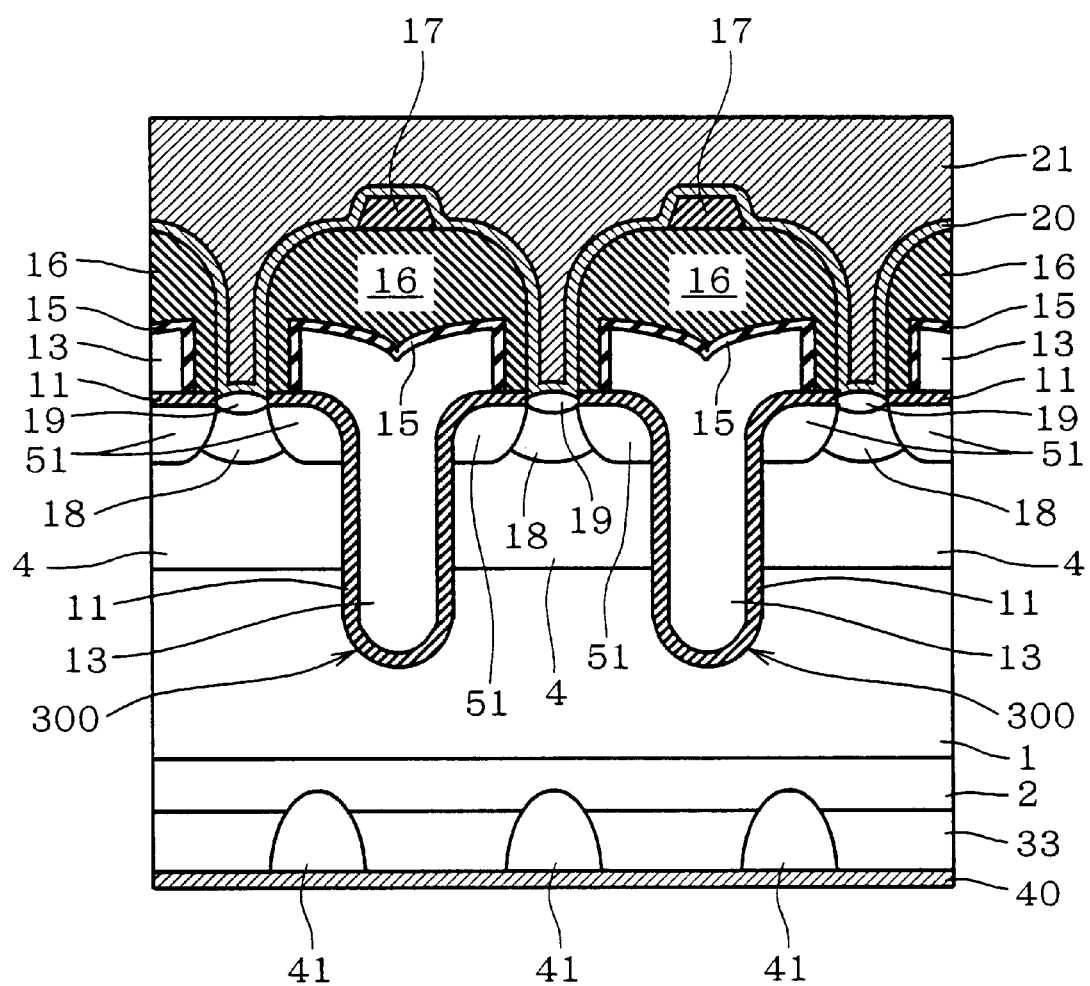

FIG. 38 is a sectional view showing the structure of a further IGBT. This structure is different from that shown in FIG. 17 in a point that oxide films 15 are formed on surfaces of gate electrodes 13 and a P$^-$-type semiconductor layer 33 is formed in place of the N-type semiconductor layer 2. This structure is different from that shown in FIG. 17 also in a point that P$^+$-type semiconductor layers 41. selectively formed over the P$^-$-type semiconductor layer 33 and an N-type semiconductor layer 2, and a collector electrode 40 which is in contact with both of the P$^+$-type semiconductor layers 41 and the P$^-$-type semiconductor layer 33 are added. The collector structure is in a P$^+$/P$^-$ structure, in order to suppress injection of holes from the collector side in a device operation.

Figure 39:
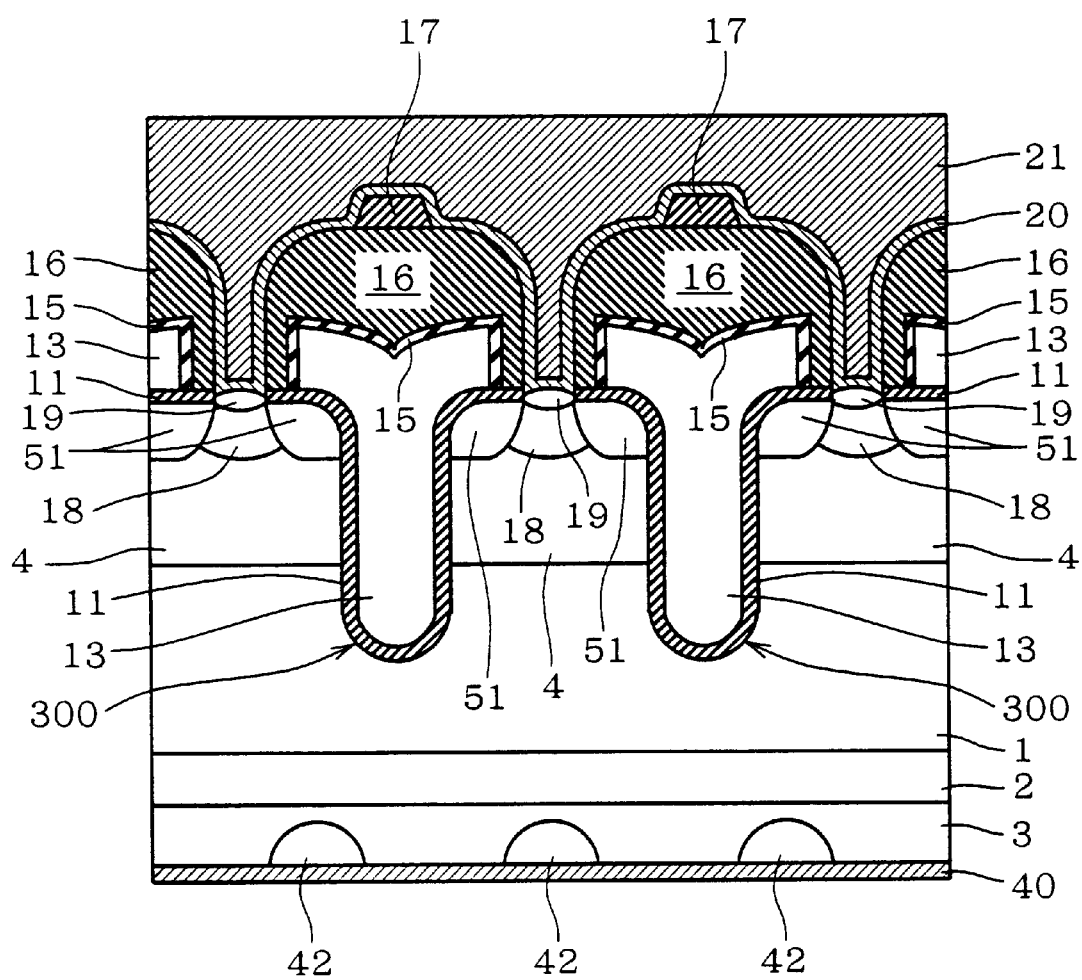
Figure 41:
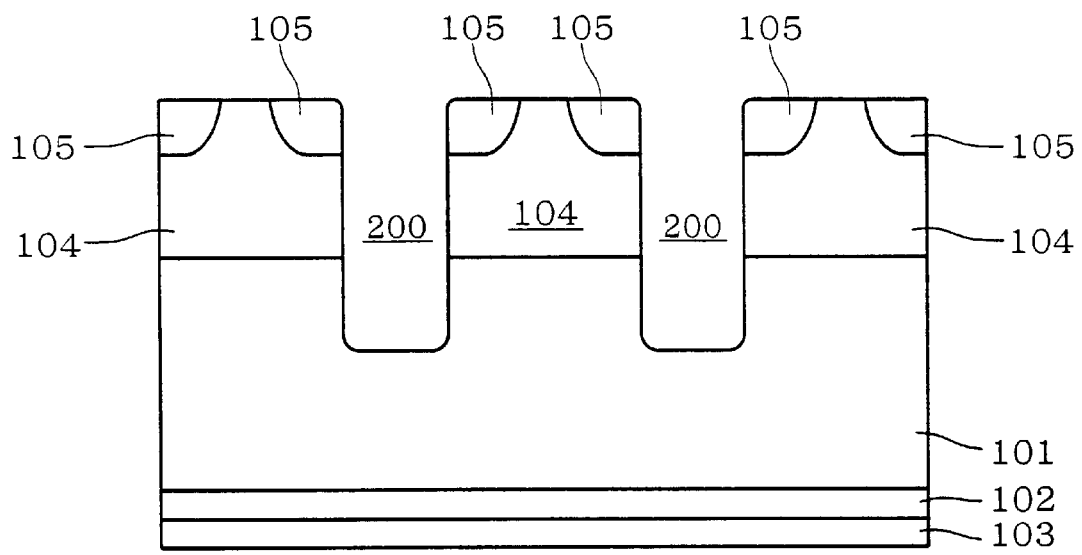
FIGS. 41 to 48 are sectional views showing the conventional process in step order.
Figure 42:
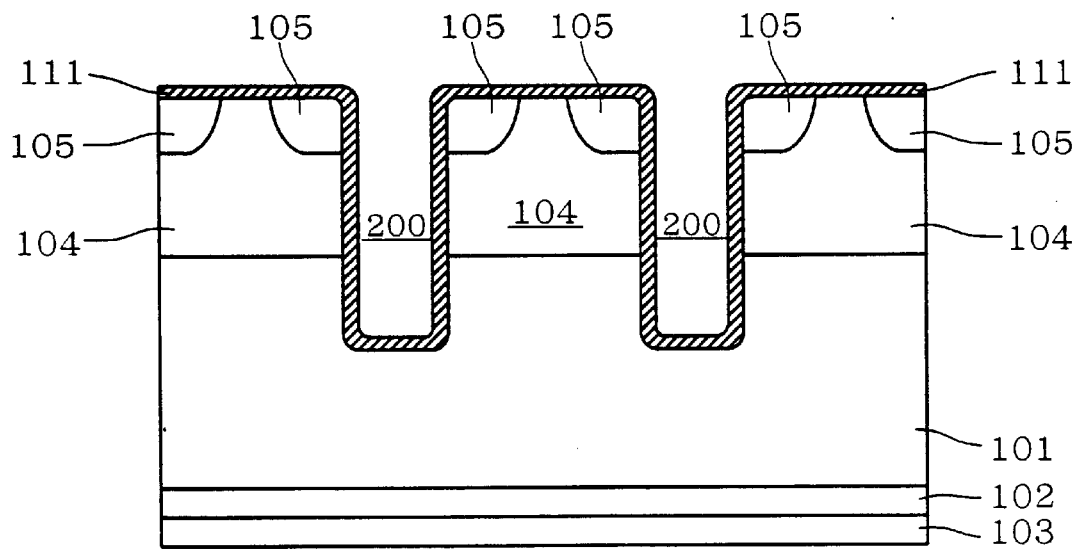
Figure 43:
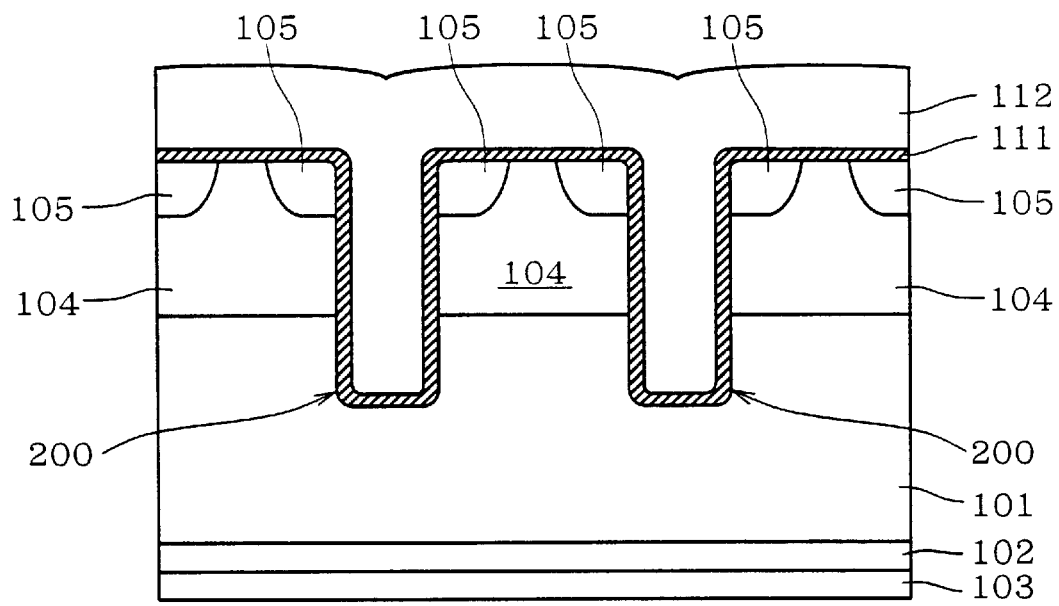

FIG. 39 is a sectional view showing the structure of a further IGBT. This structure is different from that shown in FIG. 17 in a point that oxide films 15 are formed on surfaces of gate electrodes 13, in a point that N$^+$-type semiconductor layers 42 selectively formed in a P$^+$-type semiconductor layer 3 are added, and in a point that a collector electrode 40 which is in contact with both of the P$^+$-type semiconductor layers 3 and the N$^+$type semiconductor layer 42 that are added. The collector structure is in a P$^+$/P$^-$ structure, in order to suppress injection of holes from the collector side in a device operation.

FIG. 40 is a sectional view showing the structure of trench MOSFETs. This structure is different from that of the IGBT shown in FIG. 17 in a point that oxide films 15 are formed on surfaces of gate electrodes 13 and an N$^+$-type semiconductor layer 43 is formed in place of the N-type semiconductor layer 2. In this structure, N$^+$-type emitter diffusion layers 51 substantially serve as sources, while the N$^+$-type semiconductor layer 43 serves as a drain.

Improvement of the trench MOS gates according to the present invention is applicable to any of the structures shown in FIGS. 36 to 40.

While the invention has been shown and described in detail, the following description is in all aspects illustrative and restrictive. It is therefore understood that numerous modifications and variations can be devised without departing from the scope of the invention.

I claim:

1. A semiconductor device comprising:

a semiconductor substrate having a main surface;

a trench having an opening on said main surface and a bottom portion in said semiconductor substrate respectively;

an insulating film being provided on an inner wall of said trench and a portion of said main surface around said opening; and a conductive material film being provided oppositely to said semiconductor substrate through said insulating film and having, a head portion being farther from said bottom portion of said trench measured from said main surface, an end surface of said head portion being separated from said opening of said trench than said inner wall by at least 0.2 μm.

2. The semiconductor device in accordance with claim 1, wherein the diameter of said head portion is at least 1.3 times the diameter of said inner wall of said trench in a linearly extending portion of said trench.

3. A semiconductor device comprising:

a semiconductor substrate;

a gate electrode configured as a gate for a channel which is formed in a thickness direction of said semiconductor substrate, where a main current flows in the channel in an operating state;

a first conductive layer provided over said gate electrode and configured as an interconnect line; and a second conductive layer, intervening between said gate electrode and said first conductive layer at least immediately above said gate electrode and having higher strength than said first conductive layer.

* * * * *